US010455142B2

(12) United States Patent
Tamaki et al.

(10) Patent No.: US 10,455,142 B2
(45) Date of Patent: Oct. 22, 2019

(54) FOCUS DETECTION APPARATUS AND METHOD, AND IMAGE CAPTURING APPARATUS

(71) Applicant: CANON KABUSHIKI KAISHA, Tokyo (JP)

(72) Inventors: Yoshihito Tamaki, Yokohama (JP); Nobutaka Mizuno, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/461,805

(22) Filed: Mar. 17, 2017

(65) Prior Publication Data

US 2017/0272643 A1 Sep. 21, 2017

(30) Foreign Application Priority Data

Mar. 18, 2016 (JP) .................................. 2016-056112

(51) Int. Cl.
*H04N 5/232* (2006.01)
*H04N 9/07* (2006.01)
(Continued)

(52) U.S. Cl.
CPC ... *H04N 5/232122* (2018.08); *H04N 5/36961* (2018.08); *H04N 9/0451* (2018.08); *H04N 9/04517* (2018.08); *H04N 9/07* (2013.01)

(58) Field of Classification Search
CPC ......... H04N 5/23212; H04N 5/232122; H04N 9/045–04563; H04N 5/232121;
(Continued)

(56) References Cited

U.S. PATENT DOCUMENTS

2014/0211076 A1* 7/2014 Inoue ....................... G02B 7/34
348/349

FOREIGN PATENT DOCUMENTS

JP 2004-134867 A 4/2004
JP 2008-052009 A 3/2008
(Continued)

OTHER PUBLICATIONS

The above foreign patent documents were cited in the Aug. 23, 2019 Japanese Office Action, which is enclosed without an English Translation, that issued in Japanese Patent Application No. 2016056112.

*Primary Examiner* — Paul M Berardesca
(74) *Attorney, Agent, or Firm* — Cowan, Liebowitz & Latman, P.C.

(57) ABSTRACT

A focus detection apparatus comprising: an acquisition unit that acquires, for each color, a correction value for correcting a pair of focus detection signals of respective colors acquired from a color image sensor based on color sensitivity information unique to the color image sensor which includes a plurality of photoelectric conversion portions for each of a plurality of microlenses, and performing photoelectric conversion on light entering via an imaging optical system to output an electric signal; a correction unit that corrects each focus detection signal by using the correction value; a generation unit that processes the pair of corrected focus detection signals of the respective colors, and generates a pair of focus detection signals; and a focus detection unit that detects an evaluation value based on the pair of focus detection signals.

13 Claims, 14 Drawing Sheets

(51) Int. Cl.
　　　*H04N 9/04*　　　(2006.01)
　　　*H04N 5/369*　　(2011.01)
(58) Field of Classification Search
　　　CPC ....... H04N 5/232123; H04N 5/232125; H04N 5/232127; H04N 5/232133; H04N 5/3696; H04N 5/36961; H01L 27/14621; H01L 27/14645; H01L 27/14667
　　　See application file for complete search history.

(56) References Cited

FOREIGN PATENT DOCUMENTS

| | | | |
|---|---|---|---|
| JP | 2009-008928 | A | 1/2009 |
| JP | 2010-078810 | A | 4/2010 |
| JP | 2010-117679 | A | 5/2010 |
| JP | 2013-171251 | A | 9/2013 |
| JP | 2014-222291 | A | 11/2014 |
| JP | 2015-222411 | A | 12/2015 |

\* cited by examiner

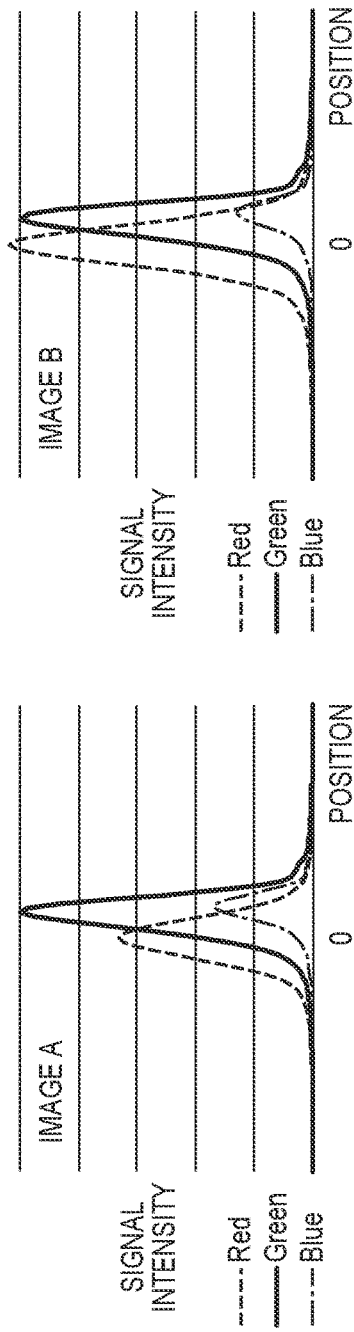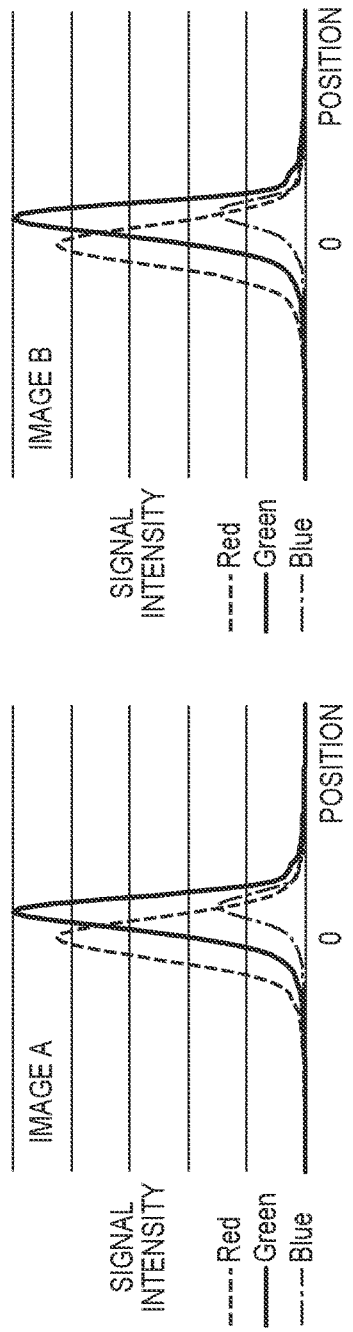

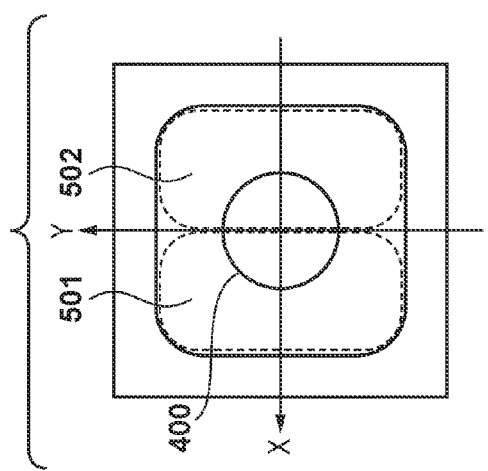
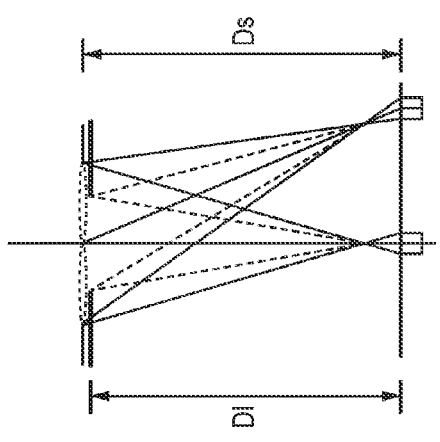
FIG. 9A
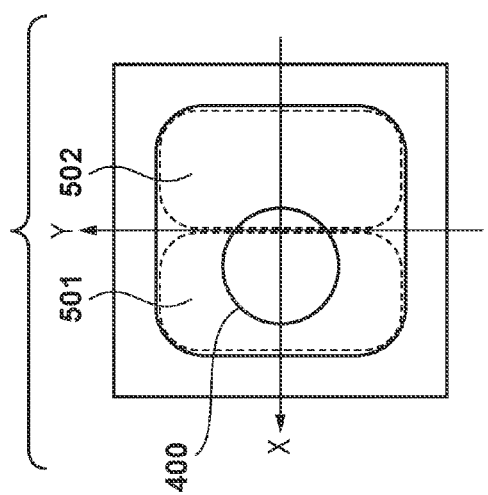
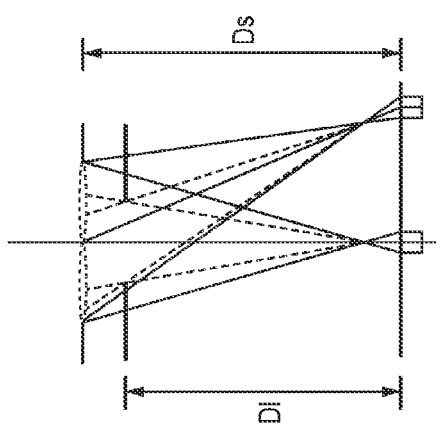
FIG. 9B
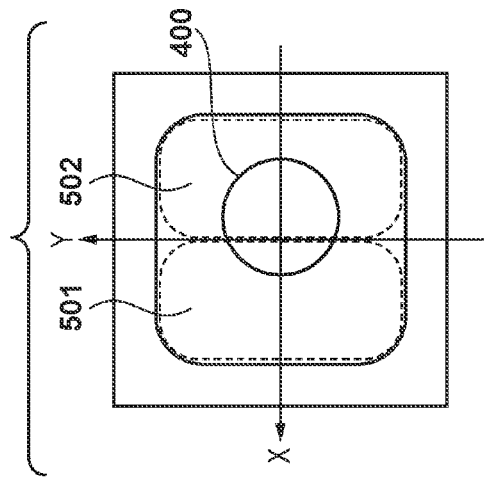
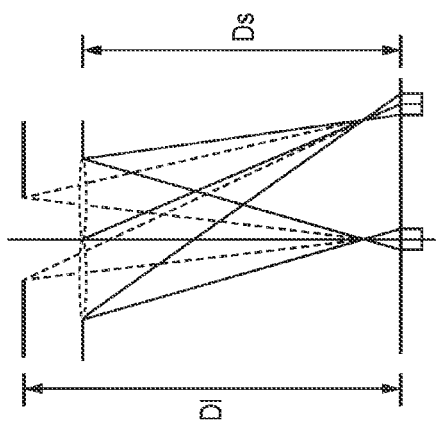
FIG. 9C

FIG. 12

|  | HORIZONTAL | | | VERTICAL | | |
|---|---|---|---|---|---|---|
|  | RED | GREEN | BLUE | RED | GREEN | BLUE |
| FOCUS DETECTION | K_AF_RH | K_AF_GH | K_AF_BH | K_AF_RV | K_AF_GV | K_AF_BV |
| CAPTURED IMAGE | K_IMG_RH | K_IMG_GH | K_IMG_BH | K_IMG_RV | K_IMG_GV | K_IMG_BV |

FOCUS DETECTION APPARATUS AND METHOD, AND IMAGE CAPTURING APPARATUS

BACKGROUND OF THE INVENTION

Field of the Invention

The present invention relates to focus detection apparatuses and methods, and image capturing apparatuses.

Description of the Related Art

One known method for detecting a focus state of an imaging lens is an automatic focus detection method of an on-imaging plane phase difference type (on-imaging plane phase difference AF), in which pupil division focus detection is performed using a two-dimensional image sensor having microlenses formed on respective pixels. For example, Japanese Patent Laid-Open No. 2008-52009 describes a configuration in which, to perform pupil division focus detection, a plurality of photoelectric conversion portions in each pixel constituting an image sensor are partitioned, and the partitioned photoelectric conversion portions receive, via a microlens, light beams that have passed through different areas of a pupil of an imaging lens.

In on-imaging plane phase difference AF, a focus detection direction and a focus detection amount can be detected simultaneously based on a pair of signals obtained from focus detection pixels formed on the image sensor, and focus adjustment can be performed at high speed. Meanwhile, since focus detection is performed using a phase difference between optical images in on-imaging plane phase difference AF, there are cases where an aberration of an imaging lens for forming optical images may cause an error in the focus detection result, and methods for reducing such an error have been proposed.

Japanese Patent Laid-Open No. 2013-171251 discloses a method for correcting a focus detection error caused as a result of the shapes of a pair of optical images formed by a pair of light beams for focus detection not coinciding with each other when in an in-focus state due to an aberration in the optical system.

Japanese Patent Laid-Open No. 2014-222291 discloses a method for correcting a focus detection error in which correction is performed using a correction value corresponding to a combination of information regarding a state of an imaging lens, information regarding a state of an image sensor, and an image height.

However, mechanisms of a focus detection error caused by a chromatic aberration of magnification in on-imaging plane phase difference AF conventionally are not known in detail, and in particular, the fact that the aforementioned focus detection error is significantly affected by the characteristics of an image sensor is not known. Characteristics of an image sensor contained in a product considerably deviate from design values due to characteristic variation and manufacturing errors in image sensors. Since the correction value for a focus detection error caused by a chromatic aberration of magnification is typically calculated based on design values for an image sensor, a problem arises in that the accuracy of the correction value is low when in actual use.

SUMMARY OF THE INVENTION

The present invention has been made in consideration of the above situation, and reduces focus detection errors caused by color sensitivity characteristics unique to an image sensor and optical characteristic such as a chromatic aberration of magnification.

According to the present invention, provided is a focus detection apparatus comprising: an acquisition unit that acquires, for each color, a correction value for correcting a pair of focus detection signals of respective colors acquired from an image sensor based on color sensitivity information unique to the image sensor, the image sensor including a plurality of photoelectric conversion portions for each of a plurality of microlenses, performing photoelectric conversion on light entering via an imaging optical system to output an electric signal, and being covered with color filters of a plurality of colors; a correction unit that corrects each of the pair of focus detection signals of the respective colors by using the correction value; a generation unit that processes the pair of focus detection signals of the respective colors corrected by the correction unit, and generates a pair of focus detection signals; and a focus detection unit that detects an evaluation value indicating a focus state, based on the pair of focus detection signals generated by the generation unit.

Further, according to the present invention, provided is an image capturing apparatus comprising: an image sensor that includes a plurality of photoelectric conversion portions for each of a plurality of microlenses, performs photoelectric conversion on light entering via an imaging optical system to output an electric signal, and is covered with color filters of a plurality of colors; a focus detection apparatus comprising: an acquisition unit that acquires, for each color, a correction value for correcting a pair of focus detection signals of respective colors acquired from the image sensor based on color sensitivity information unique to the image sensor, the image sensor; a correction unit that corrects each of the pair of focus detection signals of the respective colors by using the correction value; a generation unit that processes the pair of focus detection signals of the respective colors corrected by the correction unit, and generates a pair of focus detection signals; and a focus detection unit that detects an evaluation value indicating a focus state, based on the pair of focus detection signals generated by the generation unit; and a control unit that controls a focus state of the imaging optical system based on the evaluation value.

Furthermore, according to the present invention, provided is a method for focus detection using a pair of focus detection signals of respective colors obtained from an image sensor, the image sensor including a plurality of photoelectric conversion portions for each of a plurality of microlenses, performing photoelectric conversion on light entering via an imaging optical system to output an electric signal, and being covered with color filters of a plurality of colors, the method comprising: acquiring, for each color, a correction value for correcting the focus detection signals based on color sensitivity information unique to the image sensor; correcting each of the pair of focus detection signals of the respective colors by using the correction value; processing the pair of corrected focus detection signals of the respective colors, and generating a pair of focus detection signals; and detecting an evaluation value indicating a focus state, based on the pair of generated focus detection signals.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 7A and 7B are diagrams showing color line images of the AF image A and the AF image B when in an in-focus state at a peripheral image height;

FIGS. 9A to 9C are diagrams showing relationships between partial pupil areas at a peripheral image height and exit pupils in the imaging optical system;

FIG. 12 is a diagram showing an example of setting information according to the second embodiment.

DESCRIPTION OF THE EMBODIMENTS

Exemplary embodiments of the present invention will be described in detail in accordance with the accompanying drawings. Note that, although the embodiments have detailed and specific configurations for the purpose of facilitating understanding and description of the present invention, the present invention is not limited to those specific configurations. For example, although a description will be given below of embodiments in which the present invention is applied to an interchangeable-lens single-lens reflex digital camera, the present invention is also applicable to a digital camera whose lens is not interchangeable, and a video camera. The present invention can also be implemented in any electronic devices having a camera, such as a mobile phone, a personal computer (laptop, tablet, desktop PC, etc.), a game machine, and the like.

First Embodiment

Description of Configuration of Image Capturing Apparatus—Lens Unit

Figure 1:
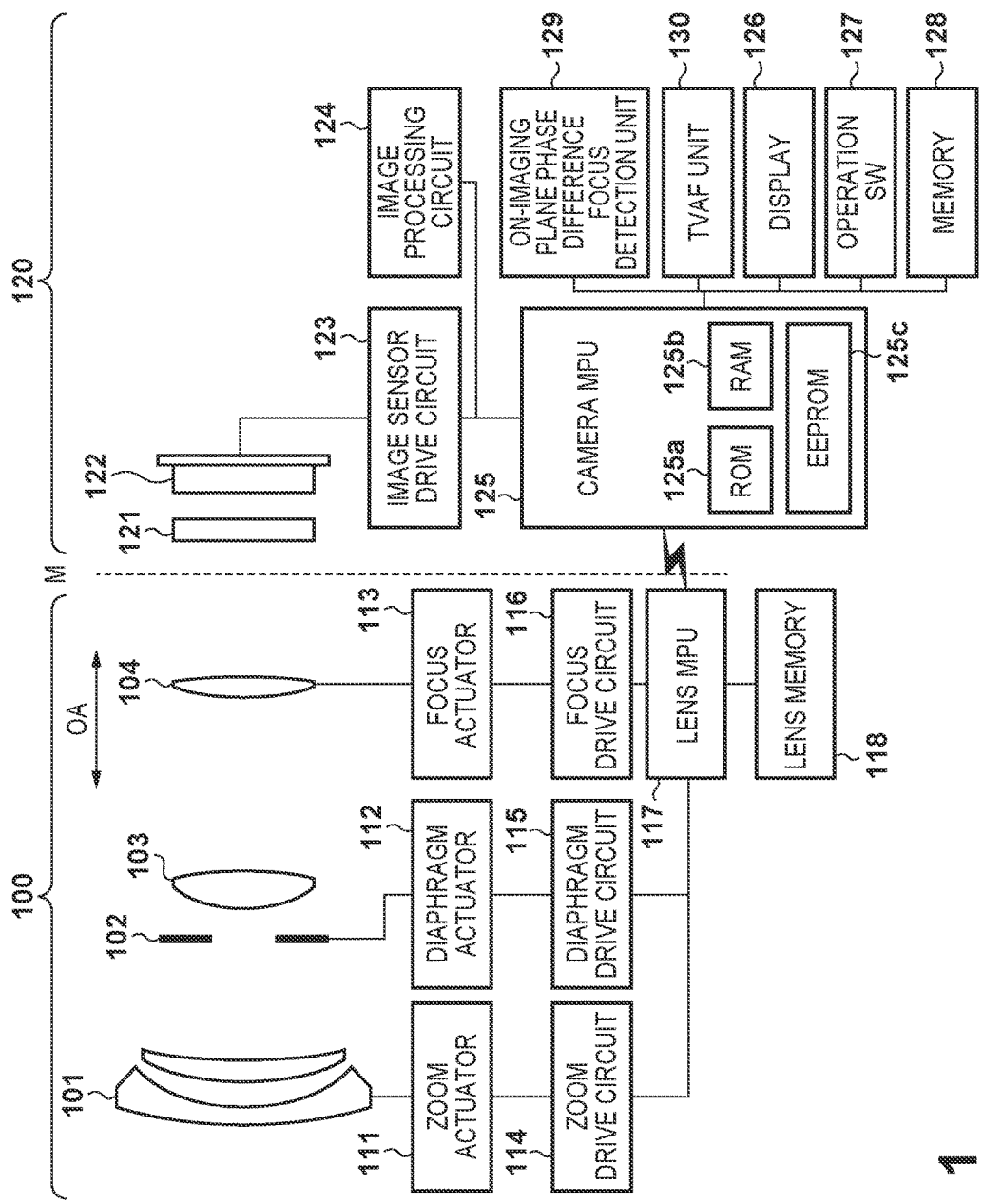
FIG. 1 is a block diagram showing a schematic configuration of a digital camera according to embodiments of the present invention.

FIG. 1 is a block diagram showing a schematic configuration of a digital camera according to the first embodiment. The digital camera according to the first embodiment is an interchangeable-lens single-lens reflex camera, and has a lens unit 100 constituted by imaging lenses, and a camera body 120. The lens unit 100 is mounted on a camera body 120 via a mount M denoted by a dotted line at the center of FIG. 1.

The lens unit 100 has an optical system (first lens group 101, diaphragm 102, second lens group 103, and focusing lens group (hereinafter referred to simply as "focusing lens") 104), and a drive/control system.

The first lens group 101 is arranged at a leading end of the lens unit 100, and is held so as to be able to move in an optical axis direction OA. The diaphragm 102 has a function of adjusting light quantity at the time of shooting by adjusting the aperture diameter thereof, and also functions as a mechanical shutter for controlling exposure time when shooting a still image. The diaphragm 102 and the second lens group 103 integrally move in the optical axis direction OA, and achieve a zoom function by moving in conjunction with the first lens group 101. The focusing lens 104 can also move in the optical axis direction OA, and the subject distance (in-focus distance) at which the lens unit 100 is in focus changes in accordance with the position of the focusing lens 104. Focus adjustment, i.e. adjustment of the in-focus distance of the lens unit 100 is performed by controlling the position of the focusing lens 104 in the optical axis direction OA.

The drive/control system has a zoom actuator 111, a diaphragm actuator 112, a focus actuator 113, a zoom drive circuit 114, a diaphragm drive circuit 115, a focus drive circuit 116, a lens MPU 117, and a lens memory 118. Information regarding a chromatic aberration of magnification or the like is stored in the lens memory 118.

The zoom drive circuit 114 drives the zoom actuator 111 in accordance with a zoom operation made by the photographer and drives the first lens group 101 and the second lens group 103 in the optical axis direction OA, thereby controlling the angle of view of the optical system of the lens unit 100. The diaphragm drive circuit 115 drives the diaphragm actuator 112 to control the aperture diameter of the diaphragm 102, and performs shooting light quantity adjustment and exposure period control during still image shooting. The focus drive circuit 116 causes the focus actuator 113 to drive the focusing lens 104 in the optical axis direction OA based on the focus detection result, thereby controlling the in-focus distance of the optical system of the lens unit 100. The focus drive circuit 116 detects the current position of the focusing lens 104 using the focus actuator 113.

The lens MPU (processor) 117 performs all calculation and control related to the lens unit 100, and controls the zoom drive circuit 114, the aperture drive circuit 115, and the focus drive circuit 116. The lens MPU 117 is connected to a camera MPU 125 through the mount M, and communicates commands and data therewith. For example, the lens MPU 117 detects the position of the focusing lens 104, and notifies the camera MPU 125 of lens position information in response to a request from the camera MPU 125. This lens position information includes information such as the position of the focusing lens 104 in the optical axis direction OA, the position in the optical axis direction OA and the diameter of an exit pupil in a state in which the optical system is not moving, and the position in the optical axis direction OA and the diameter of a lens frame that restricts light beams at the exit pupil. The lens MPU 117 also controls the zoom drive circuit 114, the aperture drive circuit 115, and the focus drive circuit 116 in accordance with a request from the camera MPU 125. Necessary optical information for on-imaging plane phase difference AF is stored in advance in the lens memory 118. The camera MPU 125 controls operations of the lens unit 100 by executing a program stored in a nonvolatile memory built into the camera MPU 125 or the lens memory 118, for example.

Description of Configuration of Image Capturing Apparatus—Camera Body

The camera body 120 has an optical system (optical low pass filter 121 and image sensor 122) and a drive/control system.

The optical low pass filter 121 mitigates false colors and moiré in a captured image. The image sensor 122 is constituted by a CMOS image sensor and a peripheral circuit, and has m pixels arranged in the horizontal direction and n pixels arranged in the vertical direction (n and m are integers that are 2 or greater). The image sensor 122 according to this embodiment has a pupil division function and is capable of on-imaging plane phase difference AF using image data, and an image processing circuit 124 generates focus detection signals and image data for display and recording by using image data that is output by the image sensor 122.

The drive/control system has an image sensor drive circuit 123, the image processing circuit 124, the camera MPU 125, a display 126, an operation switch group 127, a memory 128, an on-imaging plane phase difference focus detection unit 129, and a TVAF unit 130.

The image sensor drive circuit 123 controls operations of the image sensor 122, performs A/D conversion on an obtained image signal, and transmits the converted image signal to the camera MPU 125 and the image processing circuit 124. The image processing circuit 124 performs image processing that is typically performed in a digital camera, such as y conversion, white balance adjustment processing, color interpolation processing, compression coding processing, and so forth, on the image signal acquired by the image sensor 122.

The camera MPU (processor) 125 performs all calculation and control related to the camera body 120, and controls the image sensor drive circuit 123, the image processing circuit 124, the display 126, the operation switch group 127, the memory 128, the on-imaging plane phase difference focus detection unit 129, and the TVAF unit 130. The camera MPU 125 is connected to the lens MPU 117 via the mount M, and communicates commands and data with the lens MPU 117. The camera MPU 125 issues, to the lens MPU 117, a request to acquire the lens position, a request to drive the diaphragm, the focusing lens, or zooming at a predetermined drive amount, a request to acquire optical information unique to the lens unit 100, and the like. The camera MPU 125 contains a ROM 125a in which a program for controlling camera operations is stored, a RAM 125b for storing variables, and an EEPROM 125c for storing various parameters. Furthermore, color sensitivity information or the like is stored in the EEPROM 125c.

The display 126 is constituted by an LCD or the like, and displays information regarding shooting modes of the camera, a preview image before shooting, an image for checking after shooting, a focus-state display image at the time of focus detection, and the like. The operation switch group 127 is constituted by a power switch, a release (shooting trigger) switch, a zoom operation switch, a shooting mode selection switch, and the like. The memory 128 is a removable flash memory, and records a captured image.

The on-imaging plane phase difference focus detection unit 129 performs on-imaging plane phase difference AF by using a focus detection signal (AF signal) obtained by the image processing circuit 124. Specifically, the image processing circuit 124 generates, as an on-imaging plane phase difference AF signal, a pair of pieces of image data formed by light beams that have passed through a pair of pupil areas in the imaging optical system, and the on-imaging plane phase difference focus detection unit 129 detects a focus shift amount based on the amount of shift between the pair of pieces of image data. Thus, the on-imaging plane phase difference focus detection unit 129 according to this embodiment does not use a dedicated AF sensor, and performs on-imaging plane phase difference AF based on the output of the image sensor 122. Note that operations of the on-imaging plane phase difference focus detection unit 129 will be described later in detail.

The TVAF unit 130 calculates various TVAF evaluation values based on contrast components in image information obtained by the image processing circuit 124, and performs focus detection processing of the contrast detection type (TVAF). In the focus detection processing of the contrast detection type, a focus evaluation value is calculated at each of a plurality of focusing lens positions while moving the focusing lens 104, and a focusing lens position at which a peak focus evaluation value is obtained is detected.

Description of Focus Detection Operation: Phase Difference AF

Figure 2A:
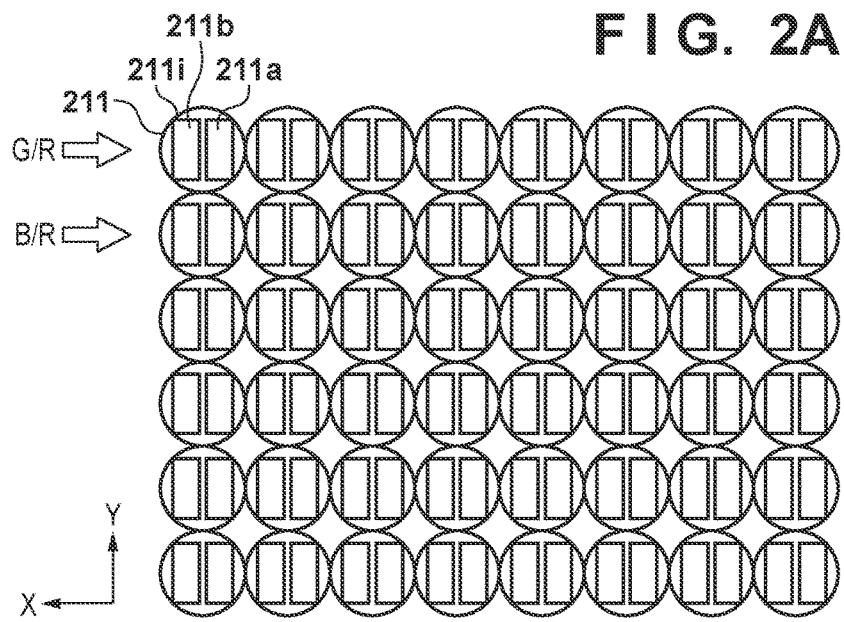
FIGS. 2A and 2B are diagrams showing an exemplary configuration of an image sensor according to the embodiments.

Next, operations of the on-imaging plane phase difference focus detection unit 129 will be described. FIG. 2A is a diagram showing a pixel array on the image sensor 122 in the present embodiment, and shows a state of an area covering 6 rows in the vertical direction (Y direction) and 8 columns in the horizontal direction (X direction) of a two-dimensional CMOS area sensor, as observed from the lens unit 100 side. Bayer array color filters are provided on the image sensor 122. In the Bayer array according to this embodiment, for example, green (G) and red (R) color filters are alternately arranged on pixels in odd-numbered rows in order from the left in the X direction, and blue (B) and green (G) color filters are alternately arranged on pixels in even-numbered rows in order from the left in the X direction. In a pixel 211, a plurality of rectangles arranged within an on-chip microlens 211i indicate photoelectric conversion portions 211a and 211b.

The photoelectric conversion portions 211a and 211b included in the image sensor 122 according to this embodiment receive light beams that have passed through different partial pupil areas of the imaging optical system, and convert the received light beams into electric signals. Note that, in this embodiment, every pixel in the image sensor 122 includes two photoelectric conversion portions that are partitioned in the X direction, and is configured to be able to read out a photoelectric conversion signal of one of two partitioned areas as well as a sum of two photoelectric conversion signals, but the present invention is not limited thereto. For example, a configuration may be employed in which the photoelectric conversion portions are partitioned in the Y direction, or a plurality of photoelectric conversions are partitioned in the X direction and the Y direction. With the read signals, by obtaining a difference between the sum of the two photoelectric conversion signals and the photoelectric conversion signal of the one of the two partitioned portions, a signal corresponding to a signal obtained in the other one of the photoelectric conversion portions can be obtained. For example, in the case where the output of a photoelectric conversion portion 211a and the sum of the outputs of the photoelectric conversion portions 211a and 211b are read out, the output of the photoelectric conversion portion 211b is acquired by subtracting the output of the photoelectric conversion portion 211a from the sum. The photoelectric conversion signals of those partitioned photoelectric conversion areas are used in focus detection of the phase difference type by means of a later-described method, and can also be used to generate a 3D image that is constituted by a plurality of images having parallax information. On the other hand, the sum of the two photoelectric conversion signals is used as a normal captured image.

An AF signal will now be described. In this embodiment, the microlens 211*i* and the partitioned photoelectric conversion portions 211*a* and 211*b* in FIG. 2A perform pupil division for exit light beams in the imaging optical system. A signal formed by combining the outputs of photoelectric conversion portions 211*a* in a plurality of pixels 211 in a predetermined range arranged in the same pixel row is used as a first focus detection signal (AF image A). Similarly, a signal formed by combining the outputs of photoelectric conversion portions 211*b* is used as a second focus detection signal (AF image B). Since the outputs of the photoelectric conversion portions 211*a* and 211*b* are outputs of any of a plurality of color components that are green, red, and blue included in a unit array of the color filters, a pseudo luminance (Y) signal generated by combining these outputs is used. However, the AF images A and B may be formed for each of the red, blue, and green colors. By detecting, using correlation calculation, a relative image shift amount between the AF images A and B generated as mentioned above, a focus shift amount (defocus amount) in a predetermined area can be detected. Since this kind of image sensor is known as disclosed in Japanese Patent Laid-Open No. 2004-134867, further description of the details thereof will be omitted.

Figure 2B:
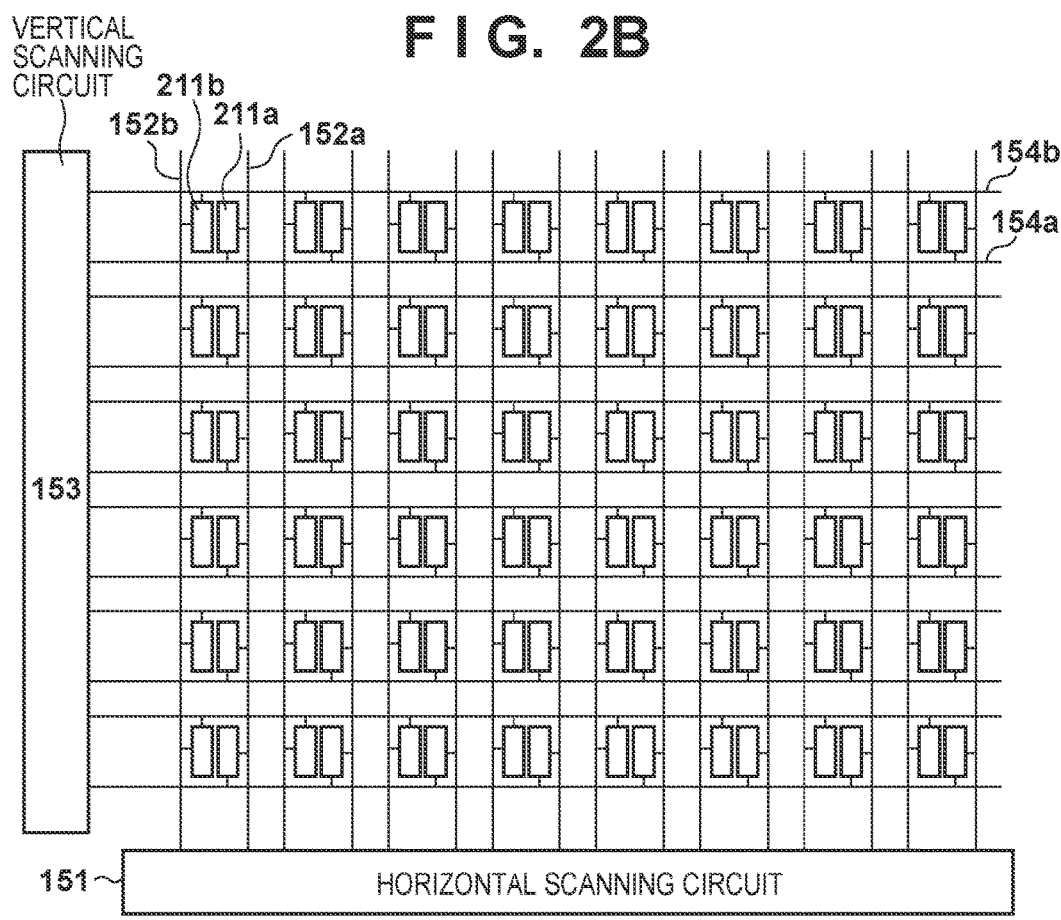

FIG. 2B is a diagram showing an exemplary configuration of a readout circuit of the image sensor 122 in the present embodiment. 151 denotes a horizontal scanning circuit, and 153 denotes a vertical scanning circuit. Horizontal scan lines 152*a* and 152*b* and vertical scan lines 154*a* and 154*b* are arranged at the boundary of each pixel, and a signal is read out from the photoelectric conversion portions 211*a* and 211*b* to the outside via these scan lines.

Note that the image sensor 122 in the present embodiment has the following two kinds of readout modes in addition to the aforementioned method for reading the pixels. The first one is called an "all-pixel readout mode", which is a mode for capturing a detailed still image. In this case, signals from all pixels are read out.

The second one is called a "thinning readout mode", which is a mode for only recording a moving image or displaying a preview image. Since the required number of pixels in this case is smaller than the number of all pixels, only pixels in a pixel group that are left after thinning at a predetermined ratio in both the X and Y directions are read out. The thinning readout mode is also used similarly in the case where the pixels need to be read out at high speed. When the pixels are thinned in the X direction, signals are added together to improve in the S/N ratio, and when the pixels are thinned in the Y direction, signal outputs from the rows to be thinned out are ignored. Typically, the on-imaging plane phase difference AF and the contrast AF are also performed based on signals that have been read out in the thinning readout mode.

Figure 3A:
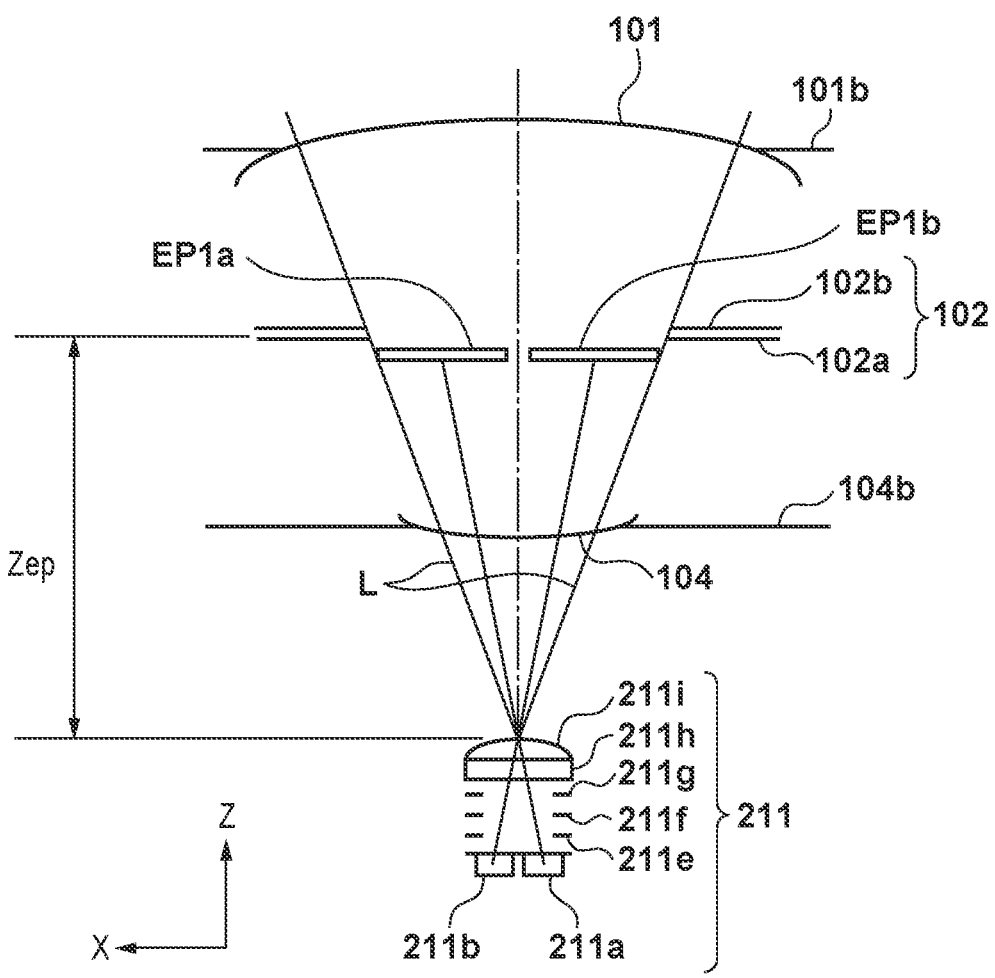
FIGS. 3A and 3B are diagrams illustrating a conjugate relation between an exit pupil plane in an imaging optical system and photoelectric conversion portions in a pixel arranged near the center of an imaging plane according to the embodiments.
Figure 3B:
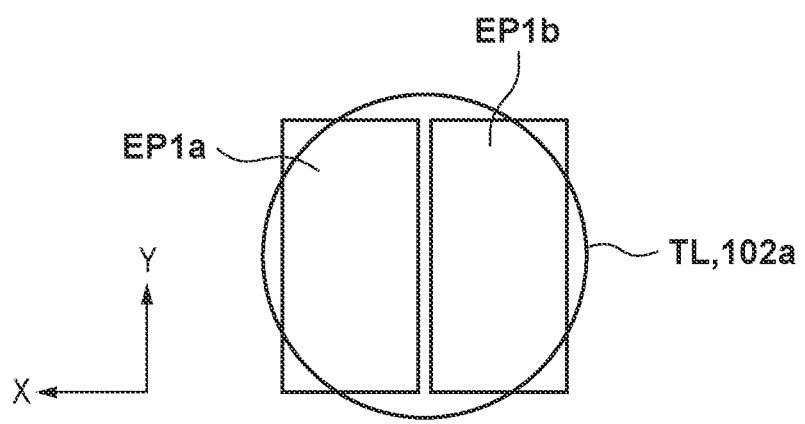

FIGS. 3A and 3B are diagrams illustrating a conjugate relation between the exit pupil plane in the imaging optical system and the photoelectric conversion portions in a pixel 211 that is arranged with an image height of zero, i.e. near the center of the imaging plane in the image capturing apparatus according to this embodiment. The photoelectric conversion portions 211*a* and 211*b* in the pixel 211 in the image sensor 122 and the exit pupil plane in the imaging optical system are designed so as to be in a conjugate relation through the on-chip microlens 211*i*. Typically, the exit pupil in the imaging optical system substantially coincides with a plane on which the diaphragm for adjusting the light quantity is placed. Meanwhile, the imaging optical system according to the present embodiment is a zoom lens having a zoom function, and, depending on the optical type, the distance of the exit pupil from the imaging plane and the size of the exit pupil change when a zoom operation is performed. FIGS. 3A and 3B show a state where the focal length of the lens unit 100 is at the center between a wide-angle end and a telephoto end. Optimum design of an eccentricity parameter suitable for the shape of the on-chip microlens 211*i* and the image height (X and Y coordinates) is achieved with the exit pupil distance Zep in this state as a standard value.

In FIG. 3A, a lens barrel member 101*b* holds the first lens group 101, and a lens barrel member 104*b* holds the focusing lens 104. The diaphragm 102 has an aperture plate 102*a* for defining the aperture diameter when in a fully open state, and aperture blades 102*b* for adjusting the aperture diameter when narrowing the diaphragm. Note that the lens barrel member 101*b*, the aperture plate 102*a*, the aperture blades 102*b*, and the lens barrel member 104*b* that act as members for restricting light beams that are to pass through the imaging optical system form an optical virtual image when observed from the imaging plane. A synthetic aperture near the diaphragm 102 is defined as the exit pupil of the lens, and the distance thereof from the imaging plane is Zep, as mentioned above.

In FIG. 3A, the pixel 211 is constituted by members that are the photoelectric conversion portions 211*a* and 211*b*, wiring layers 211*e* to 211*g*, a color filter 211*h*, and an on-chip microlens 211*i* in this order from the lowermost layer. The two photoelectric conversion portions 211*a* and 211*b* are projected to the exit pupil plane in the imaging optical system by the on-chip microlens 211*i*. In other words, the exit pupil of the imaging optical system is projected to front surfaces of the photoelectric conversion portions 211*a* and 211*b* via the on-chip microlens 211*i*.

FIG. 3B shows projected images of the photoelectric conversion portions 211*a* and 211*b* on the exit pupil plane in the imaging optical system, and EP1*a* and EP1*b* denote the projected images corresponding to the photoelectric conversion portions 211*a* and 211*b* in FIG. 3A, respectively. In this embodiment, as mentioned above, the image sensor 122 can obtain the output of either one of the two photoelectric conversion portions 211*a* and 211*b*, as well as the output of the sum of the outputs of both photoelectric conversion portions 211*a* and 211*b*. The sum of both outputs is obtained by performing photoelectric conversion on light beams that have passed through both areas of the projected images EP1*a* and EP1*b*, which substantially cover the entire pupil area of the imaging optical system.

In FIG. 3A, where L denotes an outermost portion of the light beams passing through the imaging optical system, the light beam L is restricted by the aperture plate 102*a* of the diaphragm, and substantially no vignetting occurs in the projected images EP1*a* and EP1*b* due to the imaging optical system. In FIG. 3B, the light beam in FIG. 3A is denoted by TL. It can be understood that substantially no vignetting occurs also in that the majority of the projected images EP1*a* and EP1*b* of the photoelectric conversion portions 211*a* and 211*b* are included within the light beam TL that is indicated by a circle. Since the light beam is restricted only by the aperture plate 102*a* of the diaphragm, it can be said that the light beam TL has substantially the same diameter as the aperture diameter of the aperture plate 102*a*. At this time, states of vignetting in the projected images EP1*a* and EP1*b* are symmetrical with respect to the optical axis at the imaging plane center, and the quantities of light received by the respective photoelectric conversion portions 211a and 211b are the same.

In the case of performing on-imaging plane phase difference AF, the camera MPU 125 controls the image sensor drive circuit 123 so as to read out the aforementioned two kinds of outputs from the image sensor 122. The camera MPU 125 then gives information regarding a focus detection area to the image processing circuit 124, and orders the image processing circuit 124 to generate the AF image A and the AF image B using the outputs of the pixels 211 included in the focus detection area and supply the generated AF images A and B to the on-imaging plane phase difference focus detection unit 129. According to this order, the image processing circuit 124 generates the AF image A and the AF image B and outputs the generated images to the on-imaging plane phase difference focus detection unit 129.

Note that, although an exemplary configuration has been described here in which the exit pupil is horizontally divided into two portions, at least some pixels in the image sensor 122 may have a configuration in which the exit pupil is vertically divided into two portions, as mentioned above. A configuration may also be employed in which the exit pupil is divided both horizontally and vertically. As a result of providing pixels in which the exit pupil is vertically divided, on-imaging plane phase difference AF is enabled that can handle both horizontal contrast and vertical contrast of a subject.

As described with reference to FIGS. 1 to 3B, the image sensor 122 has not only the imaging function but also the focus detection pixels for receiving light beams that have passed through the divided exit pupils, and accordingly can perform on-imaging plane phase difference AF.

Description of Focus Detection Area

Figure 4:
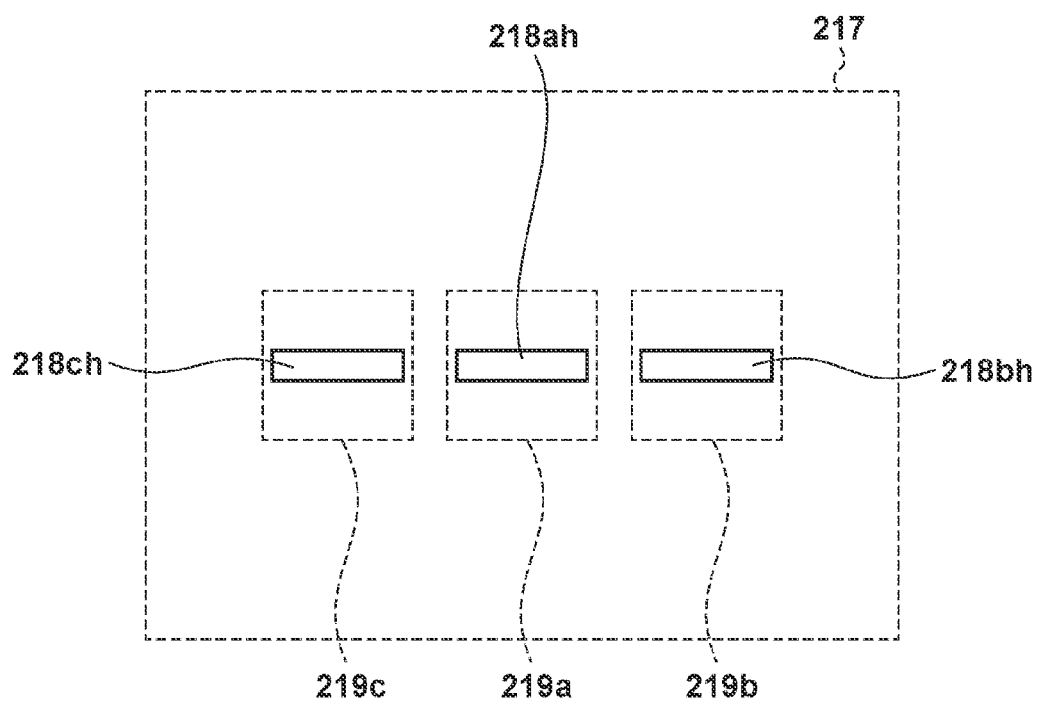
FIG. 4 is a diagram showing an example of focus detection areas in the embodiments.

FIG. 4 is a diagram showing focus detection areas within an imaging area, and on-imaging plane phase difference AF and TVAF are performed based on signals obtained within those focus detection areas from the image sensor 122. In FIG. 4, a rectangle denoted by dotted lines is an imaging area 217 of the image sensor 122. Three focus detection areas 218ah, 218bh, and 218ch for performing on-imaging plane phase difference AF are formed in a lateral direction within the imaging area 217. The first embodiment employs a configuration in which the focus detection areas for on-imaging plane phase difference AF are provided at three portions, namely at the center of the imaging area 217, as well as on the left and right side thereof. Focus detection areas 219a, 219b, and 219c for performing TVAF are formed so as to include the three focus detection areas 218ah, 218bh, and 218ch for on-imaging plane phase difference AF, respectively. In the focus detection area for performing TVAF, the TVAF unit 130 performs contrast detection using focus evaluation values in the horizontal and vertical directions.

Note that FIG. 4 shows an example in which the focus detection areas are arranged in roughly three areas, but the invention is not limited to three areas, and a plurality of areas may be arranged at any position. In the case where the photoelectric conversion portions are partitioned in the Y direction, areas in which pixels are arranged in the vertical direction may be set as focus detection areas for on-imaging plane phase difference AF.

Focus Detection Processing Flow

Figure 5:
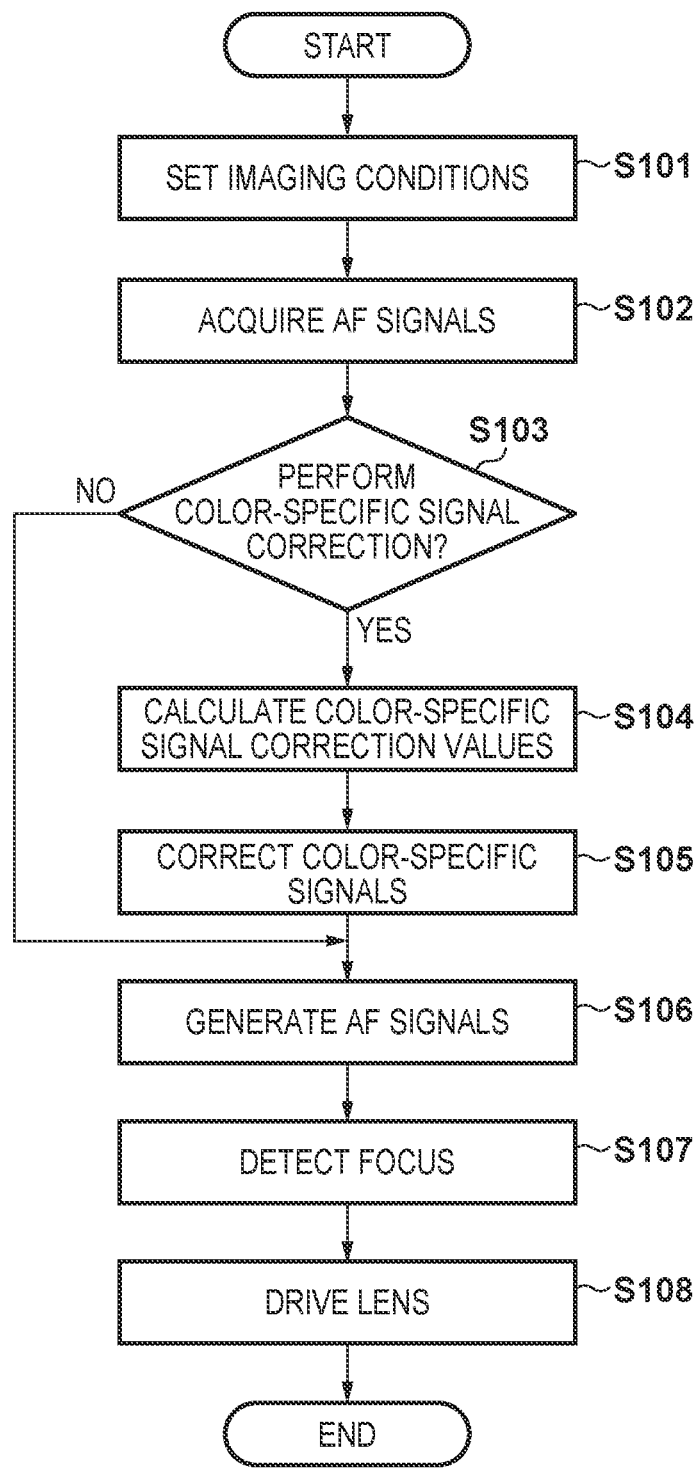
FIG. 5 is a flowchart of an AF operation according to the first embodiment.

Next, a description will be given, with reference to a flowchart in FIG. 5, of on-imaging plane phase difference AF processing according to the first embodiment that is performed in the image capturing apparatus having the above configuration. Note that the following AF processing is executed mainly by the camera MPU 125, except for when it is clearly stated that other members perform the operation. When the camera MPU 125 drives or controls the lens unit 100 by transmitting a command or the like to the lens MPU 117, it is stated in some cases that the camera MPU 125 performs the operation for simplification of the description.

In step S101, the camera MPU 125 sets imaging conditions such as shutter speed Tv, f-number F, a focus detection area, and the focal length. Note that the focus detection area to be set here may be determined based on the main subject, or may be a preset focus detection area. Here, as an example, coordinates (x1, y1) (representative point) that represent the focus detection area 218ch shown in FIG. 4 are set as the focus detection area. Note that, in the description of this embodiment, the set representative coordinates are the center coordinates of the focus detection area 218ch.

Next, in step S102, the camera MPU 125 acquires AF signals to be used in on-imaging plane phase difference AF. Here, the camera MPU 125 acquires an AF image A (AF_A (i)) formed by combining the outputs of the photoelectric conversion portions 211a of the plurality of pixels 211 included in the set focus detection area, and an AF image B (AF_B(i)) formed by combining the outputs of the photoelectric conversion portions 211b. The AF signals obtained in step S102 are signals obtained immediately after being acquired for the respective RGB colors from the image sensor 122, and separately have a value of any of the RGB colors (AF_A(i)={rA(i), gA(i), bA(i)}, AF_B(i)={rB(i), gB(i), bB(i)}).

In step S103, the camera MPU 125 communicates with the MPU 117, and determines whether or not to perform color-specific signal correction, based on the exit pupil distance in the lens, the f-number F, the image height (x1, y1), and information regarding a chromatic aberration of magnification stored in the lens memory 118 that are obtained from the imaging conditions set in step S101. Note that the exit pupil distance in the lens changes depending on the zoom state, the focus state, or the like of the lens. Here, if the exit pupil distance in the lens is greater than or equal to a reference pupil distance, or the aperture is smaller than a predetermined aperture, or the image height is smaller than a predetermined image height, it is determined that color-specific signal correction is not to be performed, and the processing proceeds to step S106. If the exit pupil distance in the lens is smaller than the reference pupil distance, the aperture is greater than or equal to the predetermined aperture, and the image height is greater than or equal to the predetermined image height, the camera MPU 125 acquires information regarding a chromatic aberration of magnification that matches the imaging conditions, from the lens information stored in the lens memory 118. The camera MPU 125 then uses the acquired information regarding the chromatic aberration of magnification to determine whether to perform color-specific signal correction. If it is determined that color-specific signal correction is to be performed, a focus detection error caused by a chromatic aberration of magnification is considered to be large, and therefore, the processing proceeds to step S104 in order to perform color-specific signal correction. On the other hand, if it is determined that color-specific signal correction is not to be performed, the focus detection error caused by a chromatic aberration of magnification is considered to be small, and therefore, the processing proceeds to step S106 in order to perform focus detection without performing color-specific signal correction.

Step S104 is performed if the focus detection error caused by a chromatic aberration of magnification is large and it is determined in step S103 that color-specific signal correction is to be performed, as mentioned above. The camera MPU 125 calculates color-specific signal correction values corresponding to the AF image A and the AF image B by using a color-specific signal correction value table stored in the EEPROM 125c, the exit pupil distance in the lens, the f-number F, and the image height (x1, y1) that are obtained from the imaging conditions set in step S101. Note that an RGB sensitivity ratio corresponding to the AF image A and the AF image B may be calculated based on the exit pupil distance in the lens, the f-number F, and the image height (x1, y1) that are obtained from the imaging conditions set in step S101, as well as the pupil intensity distribution (distribution of light reception efficiency relative to the incident angle) stored in the EEPROM 125c. In this embodiment, the EEPROM 125c has the pupil intensity distribution, but may hold coefficients of functions corresponding to imaging conditions, and the RGB sensitivity ratio may be calculated from the coefficients. Alternatively, the EEPROM 125c may have RGB sensitivity ratios corresponding to imaging conditions. RGB pupil intensity distributions stored in the EEPROM 125c are pupil intensity distributions of red, green, and blue for respective AF signals (image A signal and image B signal).

In the following description, the RGB sensitivity ratios corresponding respectively to the AF image A and the AF image B at the coordinates (x1, y1), which is representative of the focus detection area 218ch, will be indicated as R_A(rA/gA, 1, bA/gA) and R_B(rB/gB, 1, bB/gB). However, these RGB sensitivity ratios may alternatively be indicated as R_A(rA, gA, bA) and R_B(rB, gB, bB), respectively, which are normalized by the G pixel.

Then, color-specific signal correction values Cc are calculated to equalize the acquired RGB sensitivity ratios corresponding to the AF image A and the AF image B. Here, a method for calculating a color-specific signal correction value Cc_rA that corresponds to the R pixel of the image A signal will be described for simplification of the description. A value obtained by dividing a post-correction sensitivity ratio rA'=(rA+rB)/2 by an acquired sensitivity ratio rA is set as a color-specific signal correction value (Cc_A=rA'/rA). Thereafter, the color-specific signal correction values for the G pixel and the B pixel are also obtained in the same manner. The color-specific signal correction values Cc are thus calculated.

Figure 6A:
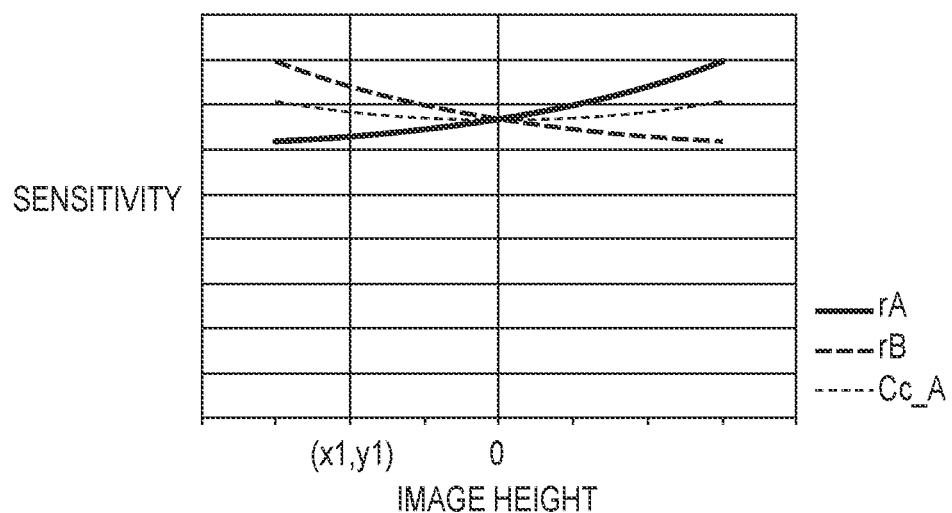
FIGS. 6A and 6B are diagrams showing sensitivities to respective colors corresponding to the image height of an AF image A and an AF image B according to the embodiments.
Figure 6B:
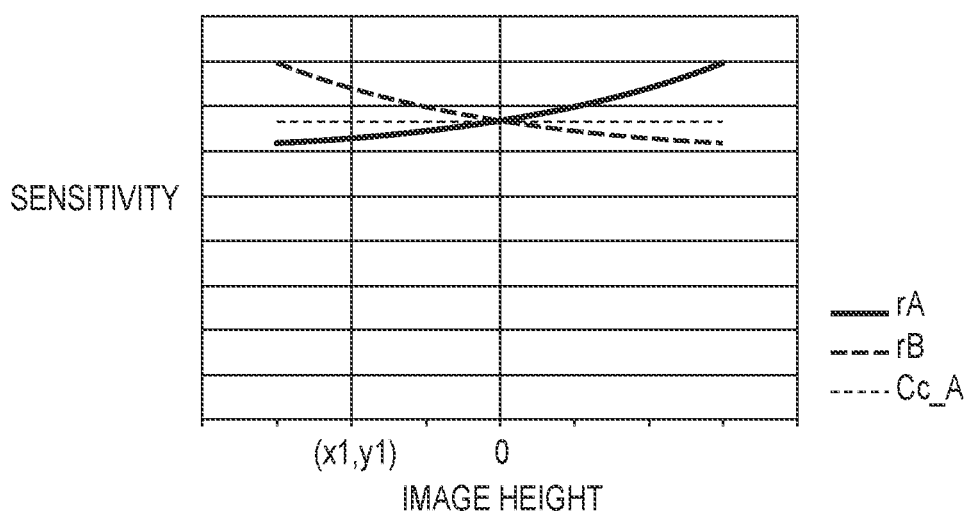

Next, in step S105, color-specific signal correction is performed. Color-specific signal correction of the present invention will now be described. FIGS. 6A and 6B show the color sensitivity ratios of the AF image A (solid lines) and the AF image B (broken lines). The horizontal axis indicates the image height, and the vertical axis indicates the sensitivity ratio of R that is normalized by the sensitivity of G, but B may also be used in a similar manner. The image height 0 represents the center image height of the focus detection area 218ch. This embodiment has described that, at the image height (x1, y1) that is a representative value of the focus detection area 218ch, the color-specific signal correction value is a value with which the RGB sensitivity ratio is an average value of the AF image A and the AF image B as shown in FIG. 6A. However, the color-specific signal correction value may be a fixed value that is the RGB sensitivity ratio at the center image height at which the influence of a chromatic aberration of magnification is little as shown in FIG. 6B, even if the RGB signal intensity ratios of the AF image A and the AF image B are different due to the influence of an assembly error or the like. The color-specific signal correction value may also be the RGB sensitivity ratio of the AF image A or the RGB sensitivity ratio of the AF image B.

The respective RGB signals of the AF image A (AF_A(i)) and the AF image B AF_B(i)) acquired in step S102 and shown in FIG. 7A are multiplied by the color-specific signal correction value Cc calculated in step S104 to correct the color-specific signal correction value Cc.

$AF\_A'(i)=\{(AF\_rA(i) \times Cc\_rA),(AF\_gA(i) \times Cc\_gA),(AF\_bA(i) \times Cc\_bA)\}$ $AF\_B'(i)=\{(AF\_rB(i) \times Cc\_rB),(AF\_gB(i) \times Cc\_gB),(AF\_bB(i) \times Cc\_bB)\}$ Thus, the post-color-specific signal correction AF image A (AF_A'(i)) and AF image B (AF_B'(i)) are generated.

In step S106, the camera MPU 125 performs Bayer addition (combination), and thereafter performs light quantity correction or the like. At this time, if it is determined in step S103 that color-specific signal correction is to be performed, the AF image A and the AF image B that have been corrected in step S105 are used. If it is determined in step S103 that color-specific signal correction is not to be performed, the AF image A and the AF image B that have been acquired in step S102 are used.

In step S107, the camera MPU 125 performs shift processing based on the shift amount stored in the EEPROM 125c, detects a phase difference that indicates a degree of coincidence between the signals in the on-imaging plane phase difference focus detection unit 129 by using a known phase difference calculation method or the like, and converts the detected phase difference into a defocus amount.

In step S108, the camera MPU 125 communicates with the lens MPU 117 to give a drive command to the focus drive circuit 116, based on the defocus amount detected in step S107. The camera MPU 125 then causes the focus drive circuit 116 that has received the command to drive the focusing lens 104 via the focus actuator 113, and ends AF processing.

Mechanism of Focus Detection Error Caused by Chromatic Aberration of Magnification A description will now be given of a mechanism of the occurrence of a focus detection error caused by a chromatic aberration of magnification. A chromatic aberration of magnification is a phenomenon in which light emitted from the same subject generates a color shift on the image sensor 122 caused by a difference in the refractive index due to the wavelength.

FIGS. 7A and 7B show examples of respective color line images of the AF image A and the AF image B in the case where, assuming that the focus detection area is at a peripheral image height, and the focusing lens 104 is located at the in-focus position. FIG. 7A shows respective color line images obtained before the color-specific signal correction according to the present invention is performed, and FIG. 7B shows respective color line images obtained after the color-specific signal correction according to the present invention is performed. In both FIGS. 7A and 7B, the vertical axis indicates signal intensity, which is normalized by the signal intensity of the G signal for the AF image A and the AF image B. The horizontal axis indicates the pixel position with the center coordinates of the focus detection area indicating 0, and a shift of the centroid position of each color line image represents a chromatic aberration of magnification. The centroid positions of the same color in the AF image A and the AF image B are substantially the same at a focus detection in-focus position.

If the R signal and the G signal in FIG. 7A are compared, the signal intensity of the R signal is smaller than that of the G signal in the AF image A. On the other hand, in the AF image B, the signal intensity of the R signal is larger than that of the G signal. Note that the signal intensity of the B signal as compared with that of the G signal is substantially the same in the AF image A and the AF image B. Thus, the reason for a difference among the RGB color sensitivity ratios in the AF image A and the RGB color sensitivity ratios in the AF image B is because the pupil intensity distribution (distribution of light reception efficiency relative to the incident angle) in the image sensor 122 differs depending on the wavelength.

Figure 8:
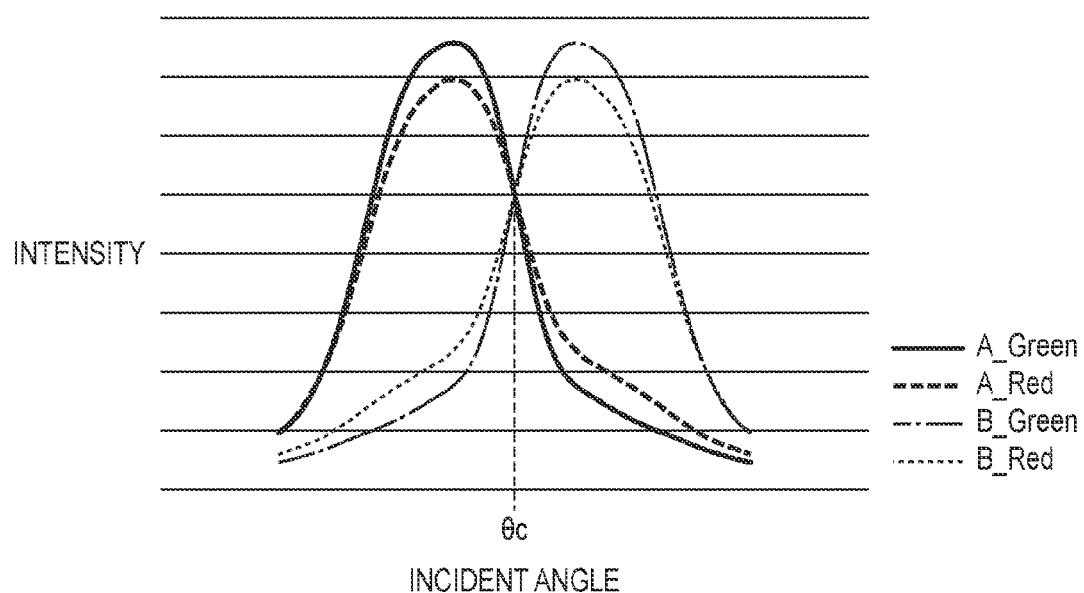
FIG. 8 shows pupil intensity distributions in R signals and G signals of the AF image A and the AF image B.

FIG. 8 shows the pupil intensity distributions of the R signals and the G signals in the AF image A and the AF image B in the image sensor 122. The horizontal axis indicates the incident angle, and the right side is the positive side. The vertical axis indicates the signal intensity that corresponds to the light reception efficiency, the signal intensity being normalized at the intersection point (incident angle θc) of the AF image A and the AF image B. The intensity of the AF image A takes the largest value when the incident angle is negative, and the intensity of the AF image B takes the largest value when the incident angle is positive. The shapes of the pupil intensity distributions of the R signal and the G signal differ due to a difference in the refractive index due to the wavelength.

As mentioned above, the eccentricity parameter is designed with a reference pupil distance Ds as a standard value, and therefore, the incident angle θc at the intersection point corresponds to the exit pupil distance Zep. The exit pupil distance Zep is an exit pupil distance in a state where the focal length of the lens unit 100 is at the center between the wide-angle end and the telephoto end. Accordingly, the closer the lens unit 100 is to the wide-angle end or the telephoto end, the more the incident angle of the light entering the focus detection pixel deviates from the incident angle θc at the intersection point.

Since, as shown in FIG. 8, the rate of change in the signal intensity relative to the incident angle is different between the R signal and the G signal, it is found that the signal intensity ratio between the R signal and the G signal is different between the AF image A and the AF image B in areas deviating from the angle at the intersection point. For example, if the incident angle is negative relative to the angle at the intersection point, the R signal has a smaller signal intensity than that of the G signal in the AF image A, but the R signal has a larger signal intensity than that of the G signal in the AF image B. In this case, the signal intensity ratio between the R signal and the G signal differs between the AF image A and the AF image B.

FIGS. 9A to 9C show a relation between a first partial pupil area 501 of the photoelectric conversion portion 211a, a second partial pupil area 502 of the photoelectric conversion portion 211b, and an exit pupil 400 in the imaging optical system at a peripheral image height of the image sensor 122. The horizontal direction of the exit pupil 400 is deemed as the X axis, and the vertical direction is deemed as the Y axis.

FIG. 9A shows the case where the exit pupil distance D1 in the imaging optical system is the same as the reference pupil distance Ds of the image sensor 122. In this case, the exit pupil 400 in the imaging optical system is roughly equally divided by the first partial pupil area 501 and the second partial pupil area 502. In terms of pupil intensity distribution, the light beam incident angle θ at each image height is substantially the same as the incident angle θc at the intersection point of the AF image A and the AF image B (θ=θc), and therefore, the strength ratios of the RGB signals in the AF image A and the AF image B are substantially the same.

FIG. 9B shows the case where the exit pupil distance D1 in the imaging optical system is shorter than the reference pupil distance Ds of the image sensor 122. FIG. 9C shows the case where the exit pupil distance D1 in the imaging optical system is longer than the reference pupil distance Ds of the image sensor 122. In both cases, pupil deviation occurs between the exit pupil in the imaging optical system and the entrance pupil in the image sensor at a peripheral image height of the image sensor 122, and the exit pupil 400 in the imaging optical system is unequally divided. When considered in terms of pupil intensity distribution, the light beam incident angle θ in FIGS. 9B and 9C deviates more from the incident angle θc at the intersection point between the AF image A and the AF image B, as the image height increases. Accordingly, the larger the deviation between the exit pupil distance D1 and the reference pupil distance Ds in the lens unit 100, and the higher the image height is, the larger the difference in the RGB signal intensities between the AF image A and the AF image B is.

Note that the incident angle θc at the intersection point between the AF image A and the AF image B is significantly affected by characteristic variation and an assembly error in the image sensor 122. Accordingly, even in the case of the same state of the lens unit 100 and the same focus detection area, the strength ratios of RGB signals in the AF image A AF image B differ depending on the state of the image sensor 122.

The on-imaging plane phase difference focus detection unit 129 performs focus detection processing using the focus detection signals obtained from the photoelectric conversion portions 211a and 211b. As mentioned above, a focus shift amount (defocus amount) is detected from a relative image shift amount of a pseudo luminance (Y) signal that is generated by combining the RGB outputs of the AF image A and the RGB outputs of the AF image B. That is to say, in the phase difference AF, it is determined that an in-focus state has been achieved when the centroid Ga of the AF image A coincides with the centroid Gb of the AF image B.

A description will be given, using FIG. 7A, of processing for calculating the centroid G(A) of the AF image A and the centroid G(B) of the AF image B with regard to the luminance (Y) signal. First, the centroid positions of the respective RGB line images indicated on the horizontal axis in FIG. 7A are Xr, Xg, and Xb. The signal intensities of the respective RGB colors indicated on the vertical axis in FIG. 7A are Sr, Sg, and Sb. Due to weighting of RGB at the time of creating a luminance (Y) signal, contributions Pi of the respective colors at the time of calculating the centroids are as follows.

$$Pr(A)=Sr(A)/(Sr(A)+2Sg(A)+Sb(A))$$

$$Pg(A)=2Sg(A)/(Sr(A)+2Sg(A)+Sb(A))$$

$$Pb(A)=Sb(A)/(Sr(A)+2Sg(A)+Sb(A))$$

$$Pr(B)=Sr(B)/(Sr(B)+2Sg(B)+Sb(B))$$

$$Pg(B)=2Sg(B)/(Sr(B)+2Sg(B)+Sb(B))$$

$$Pb(B)=Sb(B)/(Sr(B)+2g(B))$$

Note that (A) indicates a value in the AF image A, and (B) indicates a value in the AF image B. The centroid G(A) of the AF image A and the centroid G(B) of the AF image B are obtained by using the sums of products of the line image centroids of RGB and the contributions Pi of the respective colors, as follows.

$$G(A)=\Sigma Xi(A) \times Pi(A), (i=r,g,b)$$

$$G(B)=\Sigma Xi(B) \times Pi(B), (i=r,g,b)$$

Note that Xi(A) denotes the line image centroid in the AF image A, and Xi(B) denotes the line image centroid in the AF image B.

As mentioned above, the line image centroid positions of the same color in the AF image A and the AF image B are substantially the same at the in-focus position, and are considered as follows.

$$Xi(A)=Xi(B)(i=r,g,b)$$

Therefore, a condition under which the centroid G(A) of the AF image A coincides with the centroid G(B) of the AF image B with regard to the luminance (Y) signal is that the contributions Pi of the respective colors in the AF image A and the AF image B coincide with each other. Accordingly, if the strength ratio of the RGB signals in the focus detection area coincide in the AF image A and the AF image B, the centroid G(A) of the AF image A coincides with the centroid G(B) of the AF image B, and therefore, the focus detection result of on-imaging plane phase difference AF coincides with the in-focus position. In contrast, if the strength ratio of the RGB signals in the focus detection area is different between the image A and the image B, a centroid difference occurs between the centroid G(A) of the AF image A and the centroid G(B) of the AF image B, and therefore, the focus detection result of on-imaging plane phase difference AF does not coincide with the focus detection in-focus position, and a focus detection error occurs.

As mentioned above, the eccentricity parameter of the image sensor 122 is designed with the exit pupil distance Zep as a standard value, and therefore, the more the exit pupil distance in the lens unit 100 deviates from Zep, the RGB sensitivity ratios in the AF image A and the AF image B are more likely to be different. Since the deviation of the exit pupil distance has more influence the higher the image height is, the focus detection error caused by a chromatic aberration of magnification increases as the image height increases.

As described above, as a result of performing color-specific signal correction so as to match the RGB sensitivity ratio in the AF image A to the RGB sensitivity ratio in the AF image B in accordance with the information regarding a chromatic aberration of magnification in the imaging optical system, a focus detection error caused by the chromatic aberration of magnification in the imaging optical system can be accurately corrected.

Second Embodiment

Next, the second embodiment of the present invention will be described. A main difference from the first embodiment lies in that, in addition to color-specific signal correction for a focus detection error caused by a chromatic aberration of magnification, various other BP corrections are also performed. In the second embodiment, various other kinds of BP (vertical/horizontal BP, color BP, and spatial frequency BP in the second embodiment) are corrected, in addition to the first embodiment. As a result, the required capacity of the lens memory 118 or the RAM 125b increases, but correction values can be calculated more accurately.

First, the details of the AF processing according to the second embodiment will be described using flowcharts shown in FIGS. 10A and 10B. The following AF processing operations are executed mainly by the camera MPU 125, except when it is clearly stated that other members perform the operation. When the camera MPU 125 drives or controls the lens unit 100 by transmitting a command or the like to the lens MPU 117, it is stated in some cases that the camera MPU 125 performs the operation, for simplification of the description.

In step S1, the camera MPU 125 sets focus detection areas. It is assumed here that, for example, three focus detection areas such as those shown in FIG. 4 are set for both on-imaging plane phase difference AF and contrast AF. Next, in step S2, the camera MPU 125 sets a close subject determination flag in the RAM 125b to 1.

In step S3, the camera MPU 125 exposes the image sensor 122 to read out image signals, and causes the image processing circuit 124 to generate image signals for on-imaging plane phase difference AF based on image data in the focus detection areas 218ah, 218bh, and 218ch for on-imaging plane phase difference AF. The camera MPU 125 also causes the image processing circuit 124 to supply RAW image data generated by the image processing circuit 124 to the TVAF unit 130, and causes the TVAF unit 130 to calculate an evaluation value based on pixel data in the focus detection areas 219a, 219b, and 219c for TVAF. Note that, before generating the image signals for on-imaging plane phase difference AF, processing for correcting asymmetry of the exit pupil caused by vignetting of light beams due to the lens frame of the imaging lenses or the like (see Japanese Patent Laid-Open No. 2010-117679) may be applied in the image processing circuit 124. The focus evaluation value calculated by the TVAF unit 130 is stored in the RAM 125b in the camera MPU 125.

In step S4, the camera MPU 125 determines whether or not a reliable peak (local maximum value) of the focus evaluation value has been detected. This is for performing focus detection of the contrast detection type, and if a reliable peak is detected, the processing is advanced to step S20 to end the focus detection processing. Note that, although the method for calculating the reliability of the peak of the focus evaluation value is not limited, for example, a method described in FIGS. 10A to 13A and 13B in Japanese Patent Laid-Open No. 2010-78810 may be used.

In the second embodiment, both phase difference AF and contrast AF are used. For this reason, if it has been found that a subject on a closer side is present in the same focus detection area or other focus detection areas, the processing may be advanced to step S5 without ending focus detection even if a reliable peak of the focus evaluation value peak has been detected. However, in that case, the position of the focusing lens 104 corresponding to the reliable peak of the focus evaluation value is stored, and the stored position of the focusing lens 104 is used as the focus detection result if a reliable focus detection result is not obtained in the processing in step S5 onward. Since a peak cannot be detected only from the result of the first focus evaluation value calculation, the processing proceeds to step S5.

In step S55, the on-imaging plane phase difference focus detection unit 129 calculates an image shift amount (phase difference) between the AF image A and the AF image B that are supplied from the image processing circuit 124, for the respective focus detection areas 218ch, 218ah, and 218bh. The on-imaging plane phase difference focus detection unit 129 then converts the image shift amount into a defocus amount using a coefficient for conversion into a defocus amount that is stored in advance. At this time, color-specific signal correction is performed on the AF image A signal and the AF image B signal in accordance with the information regarding a chromatic aberration of magnification in the imaging optical system, as described regarding the focus detection processing using the flowchart in FIG. 5 in the first embodiment.

Furthermore, determination is also performed on the reliability of the calculated defocus amount, and only the defocus amount of the focus detection area that has a predetermined reliability according to the determination is used in subsequent AF processing. The phase difference detected between the pair of image signals contains more errors the larger the defocus amount is, due to the influence of vignetting caused by the lens frame or the like. For this reason, it can be determined that the obtained defocus amount does not have the predetermined reliability (i.e., has a low reliability) if the obtained defocus amount is larger than a threshold value, if the degree of coincidence between the shapes of the pair of image signals is low, or if the contrast of the image signals is low. The case where it is determined that the obtained defocus amount has the predetermined reliability will be expressed as "the defocus amount can be calculated" in the following description. The case where the defocus amount cannot be calculated for some reason and the case where it is determined that the reliability of the calculated defocus amount is low will be expressed as "the defocus amount cannot be calculated".

In step S6, the camera MPU 125 checks whether or not the defocus amount can be calculated in all of the focus detection areas 218$ah$, 218$bh$, and 218$ch$ for on-imaging plane phase difference AF that are set in step S1. If the defocus amount has been calculated in all focus detection areas, the camera MPU 125 advances the processing to step S20.

In step S20, a BP (best focal point) correction value (BP) is calculated for the focus detection area in which a defocus amount that indicates a closest subject has been calculated among the calculated defocus amounts. Here, the reason for selecting the closest subject is because, typically, a subject that a photographer wants to focus on is often present on the closer side. The BP correction value (BP) is a value for correcting a difference between the in-focus position in a recorded image and the focus detection result, and is calculated for the following reason.

A usual subject has contrast in both the horizontal and vertical directions, and a focus state in a captured image is also evaluated while giving consideration to the contrast in both the horizontal and vertical directions. On the other hand, when performing focus detection only in the horizontal direction as in the aforementioned AF of the phase-difference detection type, an error (vertical/horizontal BP) occurs between the focus detection result in the horizontal direction and a focus state in both the horizontal and vertical directions of a captured image. This error occurs due to astigmatism or the like in the imaging optical system. There is also an error (color BP) that occurs due to a difference between colors evaluated when a recorded image is appreciated and colors used in the focus detection signals. This error occurs when the imaging optical system has a chromatic aberration.

The BP correction value (BP) is a correction value for correcting the aforementioned errors, and is calculated while giving consideration to the selected focus detection area, the position of the focusing lens 104, the position of the first lens group 101 that indicates a zoom state, and the like. The details of the calculation method will be described later.

In step S21, the camera MPU 125 corrects the focus detection result DEF_B by using Equation (1) below using the BP correction value (BP) calculated in step S20, and calculates a post-correction focus detection result DEF_A.

$$DEF\_A = DEF\_B + BP \quad (1)$$

In step S22, the focusing lens 104 is driven based on the post-correction defocus amount DEF_A calculated using Equation (1) (focus control). Next, the processing proceeds to step S23, in-focus display is performed on the display 126 regarding the focus detection area in which the defocus amount used for driving the lens was calculated, and AF processing ends.

Thus, in the second embodiment, color-specific signal correction for a focus detection error caused by a chromatic aberration of magnification as well as various other BP corrections are performed. In the second embodiment, to calculate various BP correction values, information regarding the position of the focusing lens 104 indicating the local maximum value of the defocus amount for each of six spatial frequencies, which is a combination of three colors, namely RGB, and two directions that are the vertical and horizontal directions is used. Thus, spatial frequency dependency can also be taken into consideration for the color BP and the vertical/horizontal BP, and more accurate correction can be performed.

Figure 10A:
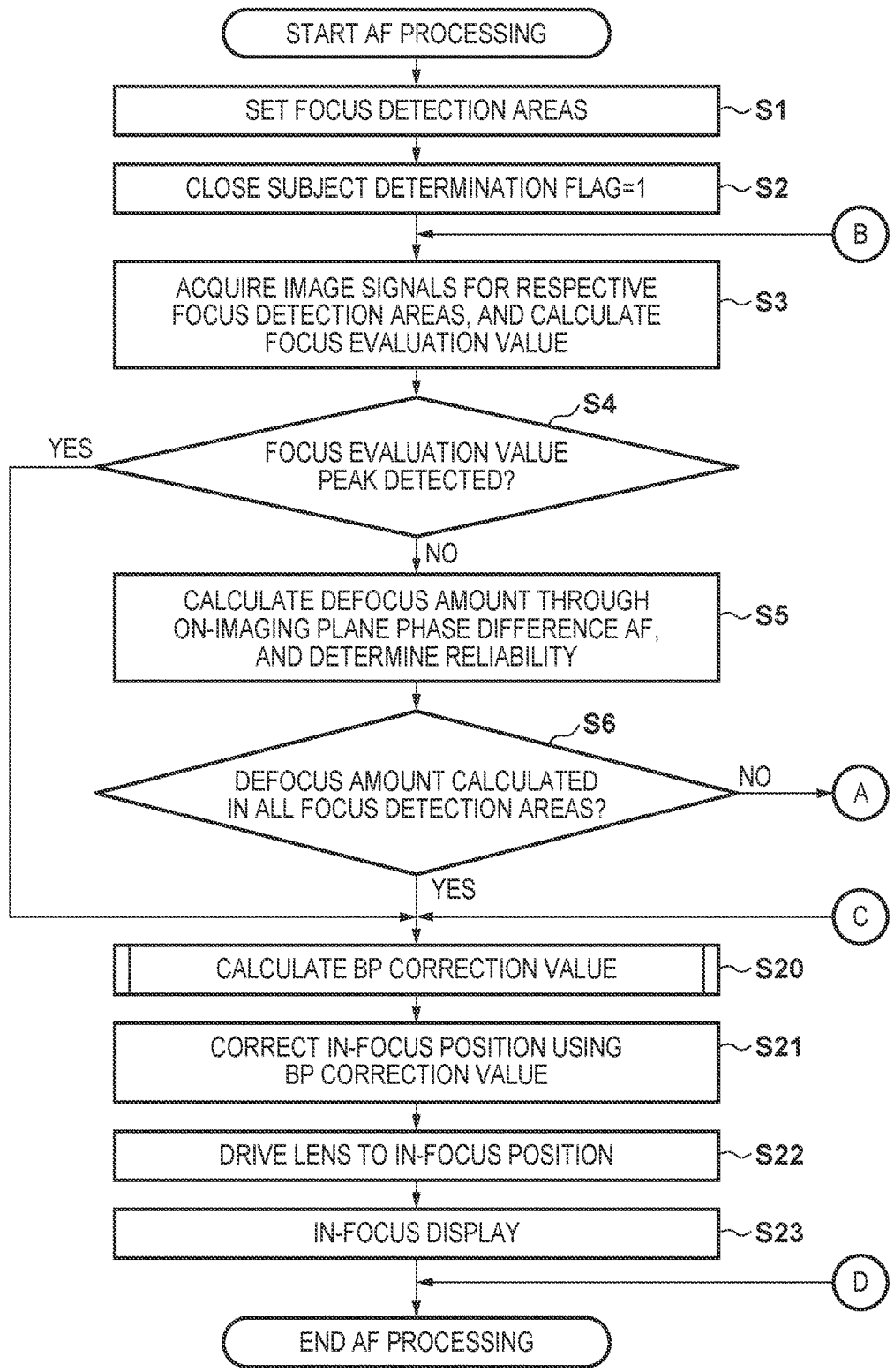
FIG. 10A is a flowchart of an AF operation according to the second embodiment.
Figure 10B:
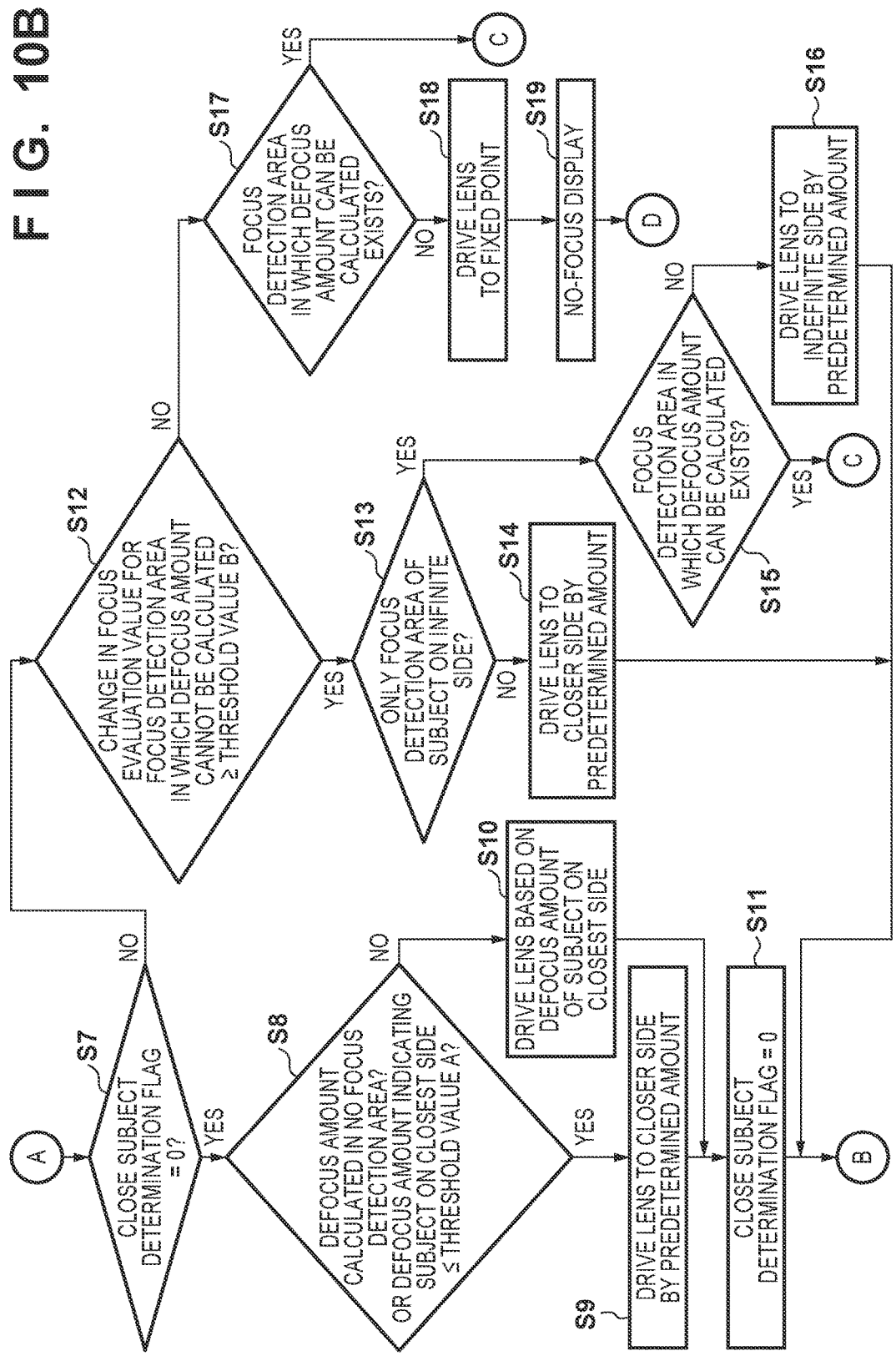
FIG. 10B is a flowchart of the AF operation according to the second embodiment.

On the other hand, if, in step S6, a focus detection area in which the defocus amount cannot be calculated exists, the camera MPU 125 advances the processing to step S7 in FIG. 10B. In step S7, the camera MPU 125 determines whether or not the close subject determination flag is 1. The close subject determination flag is 1 when the focusing lens has not been driven even once since the AF operation started. If the focusing lens has been driven, the close subject determination flag is 0. If the close subject determination flag is 1, the camera MPU 125 advances the processing to step S8.

If, in step S8, the camera MPU 125 cannot calculate the defocus amount in any of the focus detection areas, or if a defocus amount indicating the presence of a subject on the closest side among the calculated defocus amounts is smaller than or equal to a predetermined threshold value A, the camera MPU 125 advances the processing to step S9. In step S9, the camera MPU 125 drives the focusing lens toward the closer side by a predetermined amount.

A description will now be given of a reason for driving the lens by the predetermined amount if the result of step S8 is Yes. First, the case where the defocus amount cannot be calculated in any of the plurality of focus detection areas is the case where a subject on which focusing is to be performed is yet to be found. For this reason, before determining that focusing cannot be performed, the lens is driven by the predetermined amount with respect to all focus detection areas in order to check the presence of a subject on which focusing is to be performed, such that determination can be made for a later-described change in the focus evaluation value. Also, the case where the defocus amount indicating the presence of the closest subject among the calculated defocus amounts is smaller than or equal to the predetermined threshold value A is the case where the focus detection area that is substantially in an in-focus state exists at this moment. In this situation, the lens is driven by the predetermined amount in order to check the possibility of the presence of a subject that has not been detected at this moment further on the closer side in the focus detection area in which the defocus amount cannot be calculated, such that determination can be made for the later-described change in the focus evaluation value. Note that the predetermined amount by which the focusing lens is driven in step S9 may be determined while giving consideration to the sensitivity to the amount of focus movement on the imaging plane with respect to the F value and the lens drive amount of the imaging optical system.

On the other hand, if the result in step S8 is No, i.e., if the defocus amount indicating the presence of a subject on the closest side among the calculated defocus amounts is larger than the predetermined threshold value A, the processing proceeds to step S10. This is the case where a focus detection area in which the defocus amount can be calculated exists, but this focus detection area is not in an in-focus state. For this reason, in step S10, the camera MPU 125 drives the lens based on the defocus amount indicating the presence of the subject on the closest side among the calculated defocus amounts.

After driving the lens in step S9 or S10, the camera MPU 125 advances the processing to step S11, sets the close subject determination flag to 0, and returns the processing to step S3 in FIG. 10A.

On the other hand, if, in step S7, the close subject determination flag is not 1 (i.e. is 0), the camera MPU 125 advances the processing to step S12. In step S12, the camera MPU 125 determines whether or not the focus evaluation value for the focus detection area for TVAF corresponding to the focus detection area in which the defocus amount cannot be calculated has changed by a predetermined threshold value B or more before and after the driving of the lens. Although the focus evaluation value increases in some cases and decreases in other cases, it is determined in step S12 whether or not the absolute value of the amount of change in the focus evaluation value is larger than or equal to the predetermined threshold value B.

Here, the case where the absolute value of the amount of change in the focus evaluation value is larger than or equal to the predetermined threshold value B means that, although the defocus amount cannot be calculated, a change in a blurred state of a subject can be detected based on an increase or a decrease in the focus evaluation value. For this reason, in the present embodiment, even in the case where the defocus amount cannot be detected by the phase difference AF, the presence of a subject is determined based on an increase or decrease in the focus evaluation value, and the AF processing is continued. Focus adjustment can thus be performed on a subject that has a large defocus amount and cannot be detected by the phase difference AF.

Here, the predetermined threshold value B used in the determination is changed in accordance with the lens drive amount. If the lens drive amount is large, a larger value is set as the threshold value B than in the case of a small lens drive amount. This is because, if a subject is present, the amount of change in the focus evaluation value increases in accordance with an increase in the lens drive amount. The threshold values B for the respective lens drive amounts are stored in the EEPROM 125c.

If the absolute value of the amount of change in the focus evaluation value is larger than or equal to the threshold value B, the camera MPU 125 advances the processing to step S13, and determines whether or not the focus detection area in which the amount of change in the focus evaluation value is larger than or equal to the threshold value B is only the focus detection area indicating the presence of a subject on an infinite side. The case where the focus detection area indicates the presence of a subject on the infinite side is the case where the focus evaluation value decreases when the lens driving direction is a direction moving toward the closer side, or the case where the focus evaluation value increases when the lens driving direction is a direction moving toward the indefinite side.

If the focus detection area in which the amount of change in the focus evaluation value is larger than or equal to the threshold value B is not only the focus detection area indicating the presence of the subject on the infinite side, the camera MPU 125 advances the processing to step S14, and drives the lens toward the closer side by a predetermined amount. This is because the focus detection area indicating the presence of a subject on the closer side is included in the focus detection area in which the amount of change in the focus evaluation value is larger than or equal to the threshold value B. Note that a reason for giving priority to a subject on the closer side is as mentioned above.

On the other hand, if, in step S13, the focus detection area in which the amount of change in the focus evaluation value is larger than or equal to the threshold value B is only the focus detection area indicating the presence of a subject on the infinite side, the camera MPU 125 advances the processing to step S15. In step S15, the camera MPU 125 determines whether or not a focus detection area in which the defocus amount can be calculated exists. In the case where a focus detection area in which the defocus amount can be calculated exists (Yes in S15), the result of phase difference AF is given priority to the presence of a subject on the infinite side based on the focus evaluation value, and accordingly, the camera MPU 125 advances the processing to step S20 in FIG. 10A.

If a focus detection area in which the defocus amount can be calculated does not exist (No in S15), the information indicating the presence of a subject is only the change in the focus evaluation value. For this reason, in step S16, the camera MPU 125 drives the lens toward the infinite side by a predetermined amount based on the change in the focus evaluation value, and returns the processing to step S3 in FIG. 10A.

The predetermined amount by which the lens is driven in steps S14 and S16 may be determined while giving consideration to the defocus amount that can be detected through phase difference AF. Although the detectable defocus amount is different depending on the subject, a lens drive amount is set in advance so as to prevent a situation where a subject cannot be detected and is overlooked when the lens is driven in a state where focus detection cannot be performed.

If the absolute value of the amount of change in the focus evaluation value is smaller than the predetermined threshold value B (No in S12), the camera MPU 125 advances the processing to step S17, and determines whether or not the focus detection area in which the defocus amount can be calculated exists. If the defocus amount cannot be calculated in any focus detection area, the camera MPU 125 advances the processing to step S18, drives the lens to a predetermined fixed point, thereafter further advances the processing to step S19, performs display indicating a no-focus state on the display 126, and ends the AF processing. This is the case where there is no focus detection area in which the defocus amount can be calculated, and there is no focus detection area in which the focus evaluation value has changed before and after the lens driving. In this case, since no information indicates the presence of a subject, the camera MPU 125 determines that focusing cannot be performed, and ends the AF processing.

On the other hand, if, in step S17, a focus detection area in which the defocus amount can be calculated is present, the camera MPU 125 advances the processing to step S20 in FIG. 10A.

Figure 11:
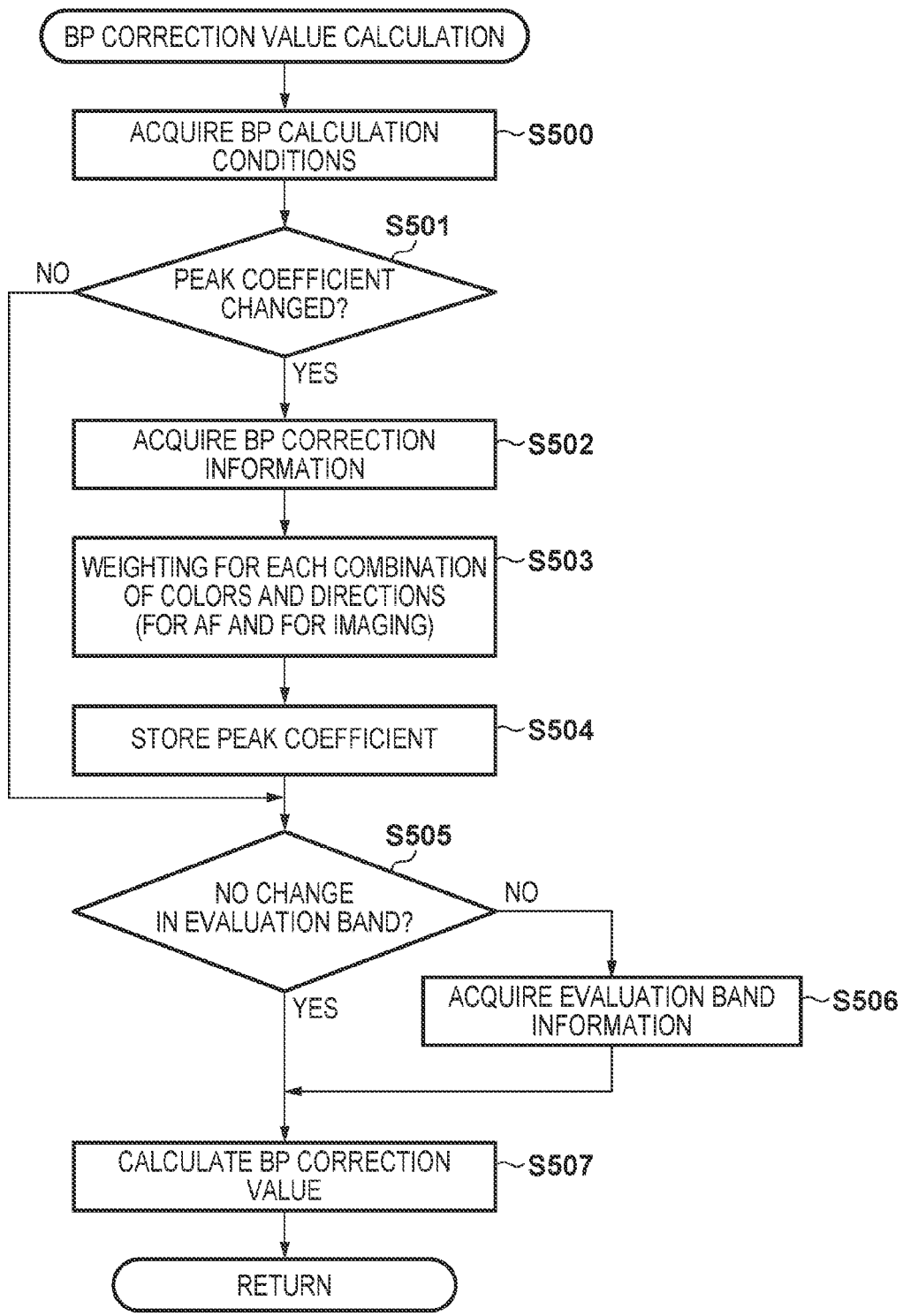
FIG. 11 is a flowchart of BP correction value calculation processing according to the second embodiment.

Next, a description will be given, using FIGS. 11 to 13B, of a method for calculating the BP correction value in step S20 in FIG. 10A. FIG. 11 is a flowchart showing the BP correction value calculation processing in step S20 in FIG. 10A.

In step S500, the camera MPU 125 acquires parameters necessary for calculating the BP correction value. The BP correction value varies with changes in the imaging optical system and changes in the focus detection optical system, such as a change in the position of the focusing lens 104, the position of the first lens group 101 that indicates the zoom state, and the position of the focus detection area. In the second embodiment, information regarding the position of the focusing lens 104, the position of the first lens group 101 that indicates the zoom state, and the position of the focus detection area is acquired. Furthermore, setting information regarding colors and evaluation directions of the signal used in focus detection and the signal used for the captured image are acquired.

FIG. 12 shows exemplary setting information regarding the colors and the evaluation directions. The setting information shown in FIG. 12 is information indicating the degree of weighting with respect to the colors (red, green, and blue) and the directions (horizontal and vertical) of contrast with which a focus state is evaluated. The setting information for focus detection is different from the setting information for the captured image. For example, when the result of contrast AF using a horizontal, green signal is corrected, the setting information for focus detection may be defined as follows:

$K\_AF\_RH=0$ $K\_AF\_GH=1$ $K\_AF\_BH=0$ $K\_AF\_RV=0$ $K\_AF\_GV=0$ $K\_AF\_BV=0$

As a result of the above setting, it can be indicated that information regarding the peak of a defocus MTF (Modulation Transfer Function) of the focus detection signal is the same as a characteristic of a green signal in the horizontal direction.

On the other hand, the following setting can be configured for a captured image.

$K\_IMG\_RH=0.15$ $K\_IMG\_GH=0.29$ $K\_IMG\_BH=0.06$ $K\_IMG\_RV=0.15$ $K\_IMG\_GV=0.29$ $K\_IMG\_BV=0.06$

These are values that are set while assuming that weighting for converting the RGB signals into signals equivalent to a Y signal is performed, the captured image is evaluated based on the Y signal, and contrast in both the horizontal and vertical directions are equally evaluated. However, set values, types of the set values, and the like are not limited thereto.

In step S501, the camera MPU 125 determines whether or not a peak coefficient has changed. This determination is performed in order to omit recalculation of the peak coefficient in the case where various conditions are identical in previously-performed BP correction value calculation and the current BP correction value calculation. In the second embodiment, if the setting information (FIG. 12) regarding the colors and the evaluation directions and the position of the focus detection area for focus detection and for a captured image are the same, steps S502 to S504 are skipped to advance the processing to step S505, omitting peak coefficient calculation.

If, in step S501, the peak coefficient is calculated for the first time, or if it is determined that the peak coefficient has changed, the processing proceeds to step S502, and the camera MPU 125 acquires BP correction information. The BP correction information is information regarding an image forming position of the imaging optical system with respect to each spatial frequency of a subject. An error due to the spatial frequency is generated mainly by a spherical aberration in the imaging optical system, and is generated by a difference between an evaluation frequency (band) of a signal used in focus detection and an evaluation frequency (band) at the time of appreciating a captured image. The BP correction information regarding six combinations of the three colors, namely RGB, and the two directions, namely vertical and horizontal directions is expressed by Equation (2) below with a spatial frequency f and a position (x, y) of the focus detection area in the image sensor 122 as variables.

$$MTF\_P\_RH(f, x, y) = (rh(0) \times x + rh(1) \times y + rh(2)) \times f^2 + \qquad (2)$$
$$(rh(3) \times x + rh(4) \times y + rh(5)) \times f + (rh(6) \times x + rh(7) \times y + rh(8))$$

Note that, although Equation (2) is an equation of information MTF_P_RH regarding the position of the focusing lens 104 at which the defocus MTF corresponding to red (R) and the horizontal (H) direction with respect to each spatial frequency takes the local maximum value, information regarding the other combinations is also expressed by similar expressions. In the second embodiment, rh(n) (0≤n≤8) is stored in advance in the lens memory 118 in the lens unit 100, and the camera MPU 125 acquires rh(n) by making a request to the lens MPU 117. However, rh(n) may be stored in a nonvolatile area of the camera RAM 125b.

Similarly, the coefficients (rv, gh, gv, bh, and bv) are also stored similarly for combinations of red and vertical (MTF_P_RV), green and horizontal (MTF_P_GH), green and vertical (MTF_P_GV), blue and horizontal (MTF_P_BH), and blue and vertical (MTF_P_BV).

Next, in step S503, the camera MPU 125 performs, on the obtained BP correction information, weighting with regard to the position of the focus detection area, the color of the evaluation signal, and the contrast direction, and processes the BP correction information. Initially, the camera MPU 125 calculates the BP correction information as described above, by using the information regarding the position of the focus detection area at the time of calculating the BP correction value. Specifically, focus detection area position information is substituted for x and y in Equation (2). With this calculation, Equation (2) is expressed as Equation (3) below.

$$MTF\_P\_RH(f) = Arh \times f^2 + Brh \times f + Crh \quad (3)$$

Similarly, MTF_P_RV(f), MTF_P_GH(f), MTF_P_GV(f), MTF_P_BH(f), and MTF_P_BV(f) are also calculated.

Figure 13A:
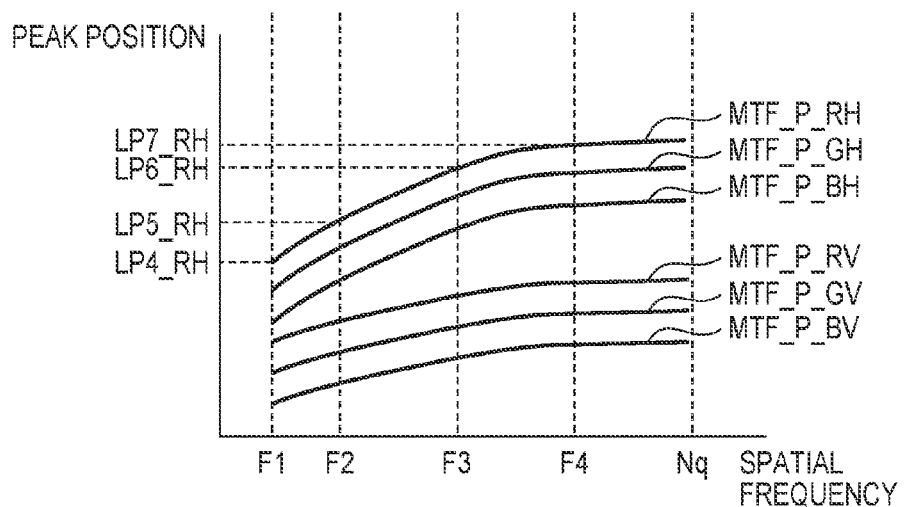
FIGS. 13A and 13B are diagrams for illustrating the BP correction value calculation processing according to the second embodiment.

FIG. 13A shows exemplary BP correction information after substituting the focus detection area position information in step S502, with the horizontal and vertical axes respectively indicating the spatial frequency and the position (peak position) of the focusing lens 104 at which the defocus MTF takes the local maximum value. As shown in FIG. 13A, the curves of the respective colors are separate from each other when a chromatic aberration is large, and the curves of the horizontal and vertical directions in FIG. 13A are separate from each other when the vertical/horizontal difference is large. Thus, in the second embodiment, each combination of the colors (RGB) and the evaluation directions (H and V) has the defocus MTF information corresponding to the respective spatial frequencies. The BP correction value can thus be accurately calculated.

Next, in step S503, weighting with regard to the color and the direction to be evaluated in focus detection and imaging is performed. Twelve coefficients that constitute the setting information acquired in step S500 is weighted using the BP correction information. Specifically, the camera MPU 125 calculates a spatial frequency characteristic MTF_P_AF(f) for focus detection and a spatial frequency characteristic MTF_P_IMG(f) for the captured image, using Equations (4) and (5).

$$MTF\_P\_AF(f) = \quad (4)$$
$$K\_AF\_RH \times MTF\_P\_RH(f) + K\_AF\_RV \times MTF\_P\_RV(f) +$$
$$K\_AF\_GH \times MTF\_P\_GH(f) + K\_AF\_GV \times MTF\_P\_GV(f) +$$
$$K\_AF\_BH \times MTF\_P\_BH(f) + K\_AF\_BV \times MTF\_P\_BV(f)$$

$$MTF\_P\_IMG(f) = \quad (5)$$
$$K\_IMG\_RH \times MTF\_P\_RH(f) + K\_IMG\_RV \times MTF\_P\_RV(f) +$$
$$K\_IMG\_GH \times MTF\_P\_GH(f) + K\_IMG\_GV \times MTF\_P\_GV(f) +$$
$$K\_IMG\_BH \times MTF\_P\_BH(f) + K\_IMG\_BV \times MTF\_P\_BV(f)$$

Figure 13B:
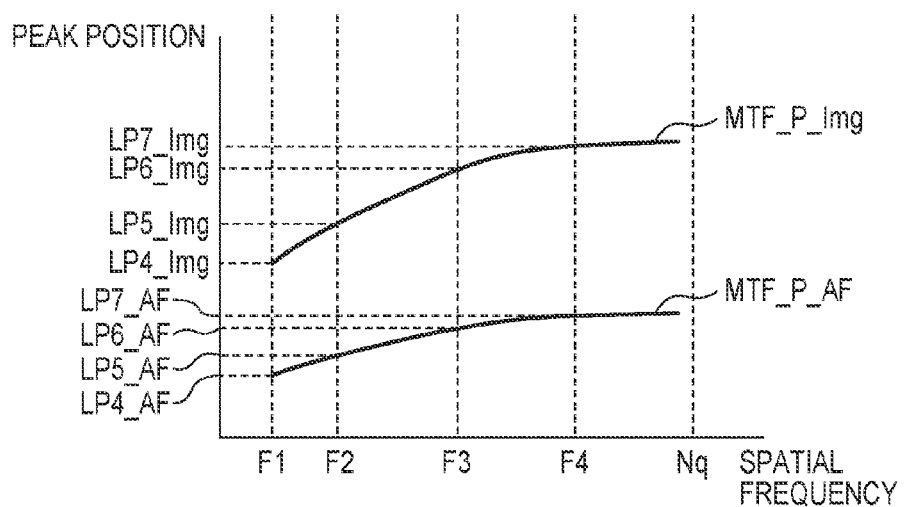

FIG. 13B shows an example of MTF_P_AF(f) and MTF_P_IMG(f) in a form similar to that in FIG. 13A. In the second embodiment, thus, variables related to the position of the focus detection area and the colors and directions to be evaluated are calculated prior to the calculation concerning the variables of the spatial frequency. As a result of the calculation, MTF_P_AF(f) and MTF_P_IMG(f) are expressed in the form of Equations (6) and (7).

$$MTF\_P\_AF(f) = Aaf \times f^2 + Baf \times f + Caf \quad (6)$$

$$MTF\_P\_IMG(f) = Aimg \times f^2 + Bimg \times f + Cimg \quad (7)$$

FIG. 13B shows, on the vertical axis, the focusing lens positions LP4_AF, LP5_AF, LP6_AF, and LP7_AF at which the defocus MTFs obtained by substituting discrete spatial frequencies F1 to F4 in Equation (6) reach their peaks (local maximum values).

In step S504, LP4_AF to LP7_AF are stored as a peak coefficient MTF_P_AF(n) (1≤n≤4) in the lens memory 118 or the RAM 125b. Similarly, LP4_Img to LP7_Img are stored as a peak coefficient MTF_P_Img(n) (1≤n≤4) in the lens memory 118 or the RAM 125b, and the processing proceeds to step S505.

Next, in step S505, the camera MPU 125 determines whether or not the evaluation band of the signal for focus detection or for the captured image has been changed, and if not, the camera MPU 125 advances the processing to step S507 and calculates the BP correction value. When calculating the BP correction value, the camera MPU 125 initially calculates an in-focus position (P_img) of the captured image and an in-focus position (P_AF) detected by AF, in accordance with Equations (8) and (9) below. An AF evaluation band W1 and a captured image evaluation band W2 are used in the calculation. The AF evaluation band W1 is a signal band used when performing contrast AF and phase difference AF, and is calculated in view of the subject, the imaging optical system, the sampling frequency of the image sensor, and the influence of a digital filter used in the evaluation. The captured image evaluation band W2 is a signal band used for a captured image, and is calculated in view of the subject, the imaging optical system, a frequency characteristic of the image sensor, and the influence of the evaluation band of a person who appreciates the captured image.

$$P\_img = MTF\_P\_Img(1) \times W1(1) + MTF\_P\_Img(2) \times W1(2) + \quad (8)$$
$$MTF\_P\_Img(3) \times W1(3) + MTF\_P\_Img(4) \times W1(4)$$

$$P\_AF = MTF\_P\_AF(1) \times W2(1) + MTF\_P\_AF(2) \times W2(2) + \quad (9)$$
$$MTF\_P\_AF(3) \times W2(3) + MTF\_P\_AF(4) \times W2(4)$$

That is to say, the information regarding the local maximum value of the defocus MTF with respect to the respective spatial frequencies shown in FIG. 13B is subjected to weighted addition using the AF evaluation band W1 and the captured image evaluation band W2. The in-focus position (P_img) of the captured image and the in-focus position (P_AF) detected by AF are thus calculated.

Next, the camera MPU 125 calculates the BP correction value (BP) using Equation (10) below.

$$BP = P\_AF - P\_img \quad (10)$$

On the other hand, if it is determined in step S505 that the evaluation band has been changed, the camera MPU 125 advances the processing to step S506 and acquires evaluation band information in accordance with settings or the status of focus detection and the captured image. Upon ending the acquisition of the evaluation band information in step S506, the camera MPU 125 advances the processing to step S507 and calculates the BP correction value.

As described above, in the second embodiment, various other BP corrections are performed in addition to color-specific signal correction for a focus detection error caused by a chromatic aberration of magnification. Furthermore, processing related to the position of the focus detection area as well as colors and the contrast directions of an evaluation signal is performed prior to processing related to the evaluation band. This is because, if the photographer has determined the position of the focus detection area through a setting, the information regarding the position of the focus detection area as well as the color and the vertical/horizontal direction to be evaluated is determined by the setting configured by the photographer and the configuration of the image capturing apparatus, and therefore is not frequently changed. On the other hand, the signal evaluation band is frequently changed due to the readout modes of the image sensor, the digital filter for the AF evaluation signal, or the like. For example, in a low-illuminance environment where the signal S/N ratio lowers, it is conceivable that the band of the digital filter is changed to a lower band, for example. In the second embodiment, in such a case, the BP correction value is calculated by calculating the coefficient that is not frequently changed (peak coefficient), thereafter storing the calculated coefficient, and calculating only the coefficient that is frequently changed (evaluation band) as necessary. The amount of calculation can thus be reduced in the case where the photographer has set the position of the focus detection area, for example.

As described above, according to the second embodiment, various other BP corrections are performed in addition to color-specific signal correction for a focus detection error caused by a chromatic aberration of magnification, and thus, various BP corrections including a correction of a focus detection error caused by a chromatic aberration of magnification can be accurately performed.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-056112, filed on Mar. 18, 2016 which is hereby incorporated by reference herein in its entirety.

What is claimed is:

1. A focus detection apparatus comprising one or more processors and/or circuitry which functions as:

an acquisition unit that acquires, for each color, correction values for respectively correcting first and second focus detection signals of a pair of focus detection signals of respective colors acquired from an image sensor based on color sensitivity information unique to the image sensor, the image sensor including a plurality of photoelectric conversion portions for each of a plurality of microlenses, performing photoelectric conversion on light entering via an imaging optical system to output an electric signal, and being covered with color filters of a plurality of colors;

a correction unit that corrects each of the first and second focus detection signals of the pair of focus detection signals of the respective colors by using the correction value;

a generation unit that combines each of the first focus detection signals of the respective colors corrected by the correction unit, combines each of the second focus detection signals of the respective colors corrected by the correction unit, and generates a pair of combined focus detection signals including the combined first focus detection signals and the combined second focus detection signals; and a focus detection unit that detects an evaluation value indicating a focus state, based on the pair of combined focus detection signals generated by the generation unit.

2. The focus detection apparatus according to claim 1, wherein the correction value is a coefficient for correcting, in an in-focus state, signal intensities of the first and second of the pair of focus detection signals of the respective colors at each image height into an average of a signal intensity of one of the first or second of the pair of focus detection signals of the respective colors and a signal intensity of the other one of the first or second of the pair of focus detection signals of the respective colors.

3. The focus detection apparatus according to claim 1, wherein the correction value is a coefficient for correcting, in an in-focus state, signal intensities of the first and second of the pair of focus detection signals of the respective colors into signal intensities of the first and second of the pair of focus detection signals of the respective colors at a center image height.

4. The focus detection apparatus according to claim 1, wherein the correction value is a coefficient for correcting, in an in-focus state, a signal intensity of one of the first or second of the pair of focus detection signals of the respective colors into a signal intensity of the other one of the first or second of the pair of focus detection signals of the respective colors.

5. The focus detection apparatus according to claim 1, wherein the acquisition unit acquires the correction value based on an exit pupil distance of the imaging optical system, an aperture, and an image height.

6. The focus detection apparatus according to claim 5, wherein the acquisition unit acquires the correction values from a storage unit in which correction values corresponding to the exit pupil distance in the imaging optical system, the aperture, and the image height have been stored in advance.

7. The focus detection apparatus according to claim 5, wherein, if a focus detection area is set in the image sensor, a representative point of the set focus detection area is set as the image height.

8. The focus detection apparatus according to claim 7, wherein the correction values acquired with the representative point as the image height is used in a correction of the first and second of the pair of focus detection signals of the respective colors that are output from the photoelectric conversion portions in the focus detection area.

9. The focus detection apparatus according to claim 1, wherein the correction is not performed if an exit pupil distance in the imaging optical system is larger than or equal to a predetermined reference pupil distance, an aperture is smaller than a predetermined aperture, or an image height of the photoelectric conversion portions that have output the first and second of the pair of focus detection signals is lower than a predetermined image height.

10. The focus detection apparatus according to claim 9, wherein, if the exit pupil distance in the imaging optical system is smaller than the predetermined reference pupil distance, the aperture is larger than or equal to the predetermined aperture, and the image height of the photoelectric conversion portions that have output the first and second of the pair of focus detection signals is higher than or equal to the predetermined image height, the acquisition unit acquires information regarding a chromatic aberration of magnification corresponding to an imaging condition, and determines whether or not to perform the correction based on the acquired information regarding a chromatic aberration of magnification, and the information regarding a chromatic aberration of magnification is a value that is relatively obtained with a predetermined specific color or wavelength as a reference.

11. The focus detection apparatus according to claim 1, further comprising a second correction unit that corrects a difference between a focus state of a captured image and a focus state represented by the evaluation value detected by the focus detection unit, the difference occurring due to at least one of astigmatism, a chromatic aberration, and a spherical aberration of the imaging optical system.

12. An image capturing apparatus comprising:
an image sensor that includes a plurality of photoelectric conversion portions for each of a plurality of microlenses, performs photoelectric conversion on light entering via an imaging optical system to output an electric signal, and is covered with color filters of a plurality of colors;
a focus detection apparatus comprising one or more processors and/or circuitry which functions as:
an acquisition unit that acquires, for each color, correction values for respectively correcting first and second focus detection signals of a pair of focus detection signals of respective colors acquired from the image sensor based on color sensitivity information unique to the image sensor, the image sensor;
a correction unit that corrects each of the first and second focus detection signals of the pair of focus detection signals of the respective colors by using the correction value;
a generation unit that combines each of the first focus detection signals of the respective colors corrected by the correction unit, combines each of the second focus detection signals of the respective colors corrected by the correction unit, and generates a pair of combined focus detection signals including the combined first focus detection signals and the combined second focus detection signals; and
a focus detection unit that detects an evaluation value indicating a focus state, based on the pair of combined focus detection signals generated by the generation unit; and
a control unit that controls a focus state of the imaging optical system based on the evaluation value.

13. A method for focus detection using first and second focus detection signals of a pair of focus detection signals of respective colors obtained from an image sensor, the image sensor including a plurality of photoelectric conversion portions for each of a plurality of microlenses, performing photoelectric conversion on light entering via an imaging optical system to output an electric signal, and being covered with color filters of a plurality of colors, the method comprising:
acquiring, for each color, correction values for respectively correcting the first and second focus detection signals based on color sensitivity information unique to the image sensor;
correcting each of the first and second focus detection signals of the pair of focus detection signals of the respective colors by using the correction value;
combining each of the first corrected focus detection signals of the respective colors, combining each of the second corrected focus detection signals of the respective colors, and generating a pair of combined focus detection signals including the combined first focus detection signals and the combined second focus detection signals; and
detecting an evaluation value indicating a focus state, based on the pair of combined generated focus detection signals.

\* \* \* \* \*